US006777706B1

(12) United States Patent
Tessler et al.

(10) Patent No.: US 6,777,706 B1
(45) Date of Patent: Aug. 17, 2004

(54) OPTICAL DEVICES

(75) Inventors: Nir Tessler, Haifa (IL); Peter Ho, St. John's College (GB); Richard Henry Friend, Cambridge (GB)

(73) Assignee: Cambridge Display Technologies, Cambridge (GB)

(*) Notice: Subject to any disclaimer, the term of this patent is extended or adjusted under 35 U.S.C. 154(b) by 0 days.

(21) Appl. No.: 09/743,692

(22) PCT Filed: Jul. 14, 1999

(86) PCT No.: PCT/GB99/02263

§ 371 (c)(1),
(2), (4) Date: Mar. 21, 2001

(87) PCT Pub. No.: WO00/04593

PCT Pub. Date: Jan. 27, 2000

(30) Foreign Application Priority Data

Jul. 14, 1998 (GB) .............................. 9815271
Apr. 6, 1999 (GB) .............................. 9907802

(51) Int. Cl.$^7$ .............................................. H01L 29/06
(52) U.S. Cl. .............................. 257/17; 257/21; 257/98; 438/69
(58) Field of Search ..................... 257/17, 21, 98; 438/69

(56) References Cited

U.S. PATENT DOCUMENTS

| | | | |
|---|---|---|---|
| 4,234,350 A | 11/1980 | Suzor ........................... | 127/48 |
| 4,501,726 A | 2/1985 | Schröder et al. ............. | 424/1.1 |
| 4,539,507 A | 9/1985 | VanSlyke et al. ........... | 313/504 |
| 4,911,903 A | 3/1990 | Unger et al. ................. | 423/335 |
| 5,118,528 A | 6/1992 | Fessi et al. ............. | 427/213.36 |
| 5,395,604 A | 3/1995 | Harris et al. ................. | 423/335 |
| 5,470,910 A | 11/1995 | Spanhel et al. ............. | 524/785 |
| 5,498,446 A | 3/1996 | Axelbaum et al. .......... | 427/212 |
| 5,560,924 A | 10/1996 | Wunderlich et al. ........ | 424/451 |
| 5,705,194 A | 1/1998 | Wong et al. ................. | 424/489 |
| 5,766,635 A | 6/1998 | Spenleuhauer et al. ..... | 424/489 |
| 5,777,433 A * | 7/1998 | Lester et al. ................. | 313/512 |
| 5,840,111 A | 11/1998 | Wiederhöft et al. ........ | 106/436 |
| 5,874,029 A | 2/1999 | Subramaniam et al. ....... | 264/12 |
| 5,874,111 A | 2/1999 | Maitra et al. ................ | 424/499 |
| 5,917,279 A | 6/1999 | Elschner et al. ............ | 313/506 |
| 6,183,658 B1 | 2/2001 | Lesniak et al. .......... | 252/62.56 |
| 2001/0001453 A1 | 5/2001 | Toraval | |

FOREIGN PATENT DOCUMENTS

| | | | | |
|---|---|---|---|---|
| CA | 2300885 | 8/1998 | | |
| DE | 4133621 A1 | 4/1993 | | |
| DE | 19540623 A1 | 5/1997 | | |
| DE | 19543205 A1 | 5/1997 | | |
| DE | 195 43 205 A1 * | 5/1997 | ........... | H04B/33/12 |
| DE | 19614136 A1 | 10/1997 | | |
| EP | 0505230 A1 | 9/1992 | | |
| EP | 0622439 A1 | 11/1994 | | |
| EP | 0686448 A2 | 12/1995 | | |
| EP | 0587672 B1 | 2/1996 | | |
| EP | 0774443 A1 | 5/1997 | | |

(List continued on next page.)

OTHER PUBLICATIONS

Carter et al, Appl. Phys. Lett. vol 71 No. 9, Sep. 1, 1997 pp 1145–1147 "Enhanced Luminance . . . Devices".*
Dabbousi et al, Appl. Phys. Lett. vol. 66 No. 11, Mar. 13, 1995 pp1316–1318 "Electroluminescence . . . composites".*
Dabbousi et al., "Electroluminescence From CdSe Quantum–Dot/Polymer Composites," Applied Physics Letters, vol. 66, No. 11, Mar. 13, 1995, pp. 1316–1318.

(List continued on next page.)

*Primary Examiner*—Jerome Jackson
(74) *Attorney, Agent, or Firm*—Finnegan, Henderson, Farabow, Garrett & Dunner, LLP

(57) ABSTRACT

An optical device having a layer comprising an organic material that includes a substantially uniform dispersion of light transmissive nanoparticles.

28 Claims, 27 Drawing Sheets

FOREIGN PATENT DOCUMENTS

| | | | |
|---|---|---|---|
| EP | 0795941 A1 | | 9/1997 |
| EP | 0795941 A1 | * | 9/1997 ............... 257/98 |
| EP | 0826633 A1 | | 3/1998 |
| JP | 5-341104 | | 12/1993 |
| JP | 7-239549 | | 9/1995 |
| JP | 11-319578 | | 11/1999 |
| WO | WO 90/13148 | | 11/1990 |
| WO | WO 92/21611 | | 12/1992 |
| WO | WO-97/24224 | * | 7/1997 ............ B32B/1/00 |
| WO | WO 97/24224 | | 7/1997 |
| WO | 97/38333 | | 10/1997 |
| WO | WO 98/17378 | | 4/1998 |
| WO | 98/51747 | | 11/1998 |
| WO | WO 99/10527 | | 3/1999 |
| WO | 99/61383 | | 12/1999 |

OTHER PUBLICATIONS

Greenham et al., "Charge Separation And Transport in Conjugated–Polymer/Semiconductor–Nanocrystal Composites Studied By Photoluminescence Quenching and Photoconductivity," Physical Review B, vol. 54, No. 24, Dec. 15 1996–II, pp. 17628–17637.

Sakai et al., "Preparation of Ultrafine Titanium Dioxide Particles Using Hydrolysis And Condensation Reactions In The Inner Aqueous Phase of Reversed Micelles: Effect of Alcohol Addition," Langmuir, vol. 14, No. 8 (1998), pp. 2208–2212.

M. P. Pileni, "Nanosized Particles Made In Colloidal Assemblies," Langmuir, vol. 13, No. 13 (1997), pp. 3266–3276.

Tanori et al., "Control of the Shape of Copper Metallic Particles By Using A Colloidal System as a Template," Langmuir, vol. 13, No. 4 (1997), pp. 639–646.

Arriagada et al., Synthesis of Nanosize Silica in Aerosol OT Reverse Microemulsions, "Journal of Colloid And Interface Science," vol. 170 (1995), pp. 8–17.

Chhabra et al., "Synthesis, Characterization, And Properties of Microemulsion–Mediated Nanophase $TiO_2$ Particles," Langmuir, vol. 11, No. 9 (1995), pp. 3307–3311.

Masse et al., "Crystal Morphology In Pristine And Doped Films of Poly(P–Phenylene Vinylene)," Journal of Materials Science, vol. 25 (1990), pp. 311–320.

T. Moritz et al., "Nanostructured Crystalline $TiO_2$ Through Growth Control And Stabilization Of Intermediate Structural Building Units," J. Phys. Chem. B, vol. 101, No. 41 (1997), pp. 8052–8053.

M. Ahlskog [a,*] et al., "Doping and Conductivity Studies on Poly (p–phenylene vinylene)," Synthetic Metals 89 (1997), pp. 11–15.

A.R. Brown et al., "A Universal Relation Between Conductivity and Field–Effect Mobility in Doped amorphous Organic Semiconductors," Synthetic Metals 68 (1994), pp. 65–70.

N. Camaioni et al., "Hall Mobility in poly(4, 4'–dipentoxy–2–2'bithiophene) as a Function of the Doping Level," Applied Physics Letters, vol. 73, No. 2, Jul. 13, 1998, pp. 253–255.

D.M. de Leeuw, "Stable Solutions of Doped Thiophene Oligomers," Synthetic Metals, 55–57 (1993) pp. 3597–3602.

C.C. Han et al., "Protonic Acids: Generally Applicable Dopants for Conducting Polymers*," Synthetic Metals, 30 b(1989) pp. 123–131.

A. G. MacDiarmid et al., "Polyaniline: A New Concert in Conducting Polymers", Synthetic Metals, 18 (1987) pp. 285–290.

B. O'Regan et al., "A Low–Cost, High–Efficiency Solar Cell Based On Dye–Sensitized Colloidal $TiO_2$ Films," Letters to Nature, vol. 33, Oct. 24, 1991, pp. 737–740.

Chiang et al., "Electrical Conductivity in Doped Polyacetylene," Physical Review Letters, vol. 39, No. 17, Oct. 24, 1977, pp. 1098–1101.

Hide et al., "Laser Emission From Solutions And Films Containing Semiconducting Polymer And Titanium Dioxide Nanocrystals," Chemical Physics Letters, vol. 256 (1996), pp. 424–430.

Schmitt et al., "Metal Nanoparticle/Polymer Superlattice Films: Fabrication And Control of Layer Structure," Advanced Materials, vol. 9, No. 1, 1997, pp. 61–65.

Carter et al., "Enhanced Luminance In Polymer Composite Light–Emitting Devices," Appl. Phys. Lett. vol. 71, No. 9, Sep. 1, 1997, pp. 1145–1147.

Colvin et al., "Light–Emitting Diodes Made From Cadmium Selenide Nanocrystals And A Semiconducting Polymer," Letters to Nature, vol. 370, Aug. 4, 1994, pp. 354–357.

Halls et al., "Efficient Photodiodes From Interpenetrating Polymer Networks," Letters to Nature, vol. 376, Aug. 10, 1995, pp. 498–500.

English language translation of office action from the Japanese Patent Office dated Dec. 16, 2003.

Oliveira et al., "Generation of wet–chemical AR–coatings on plastic substrates by use of polymerizable nanoparticles," SPIE 3136:452–461.

* cited by examiner

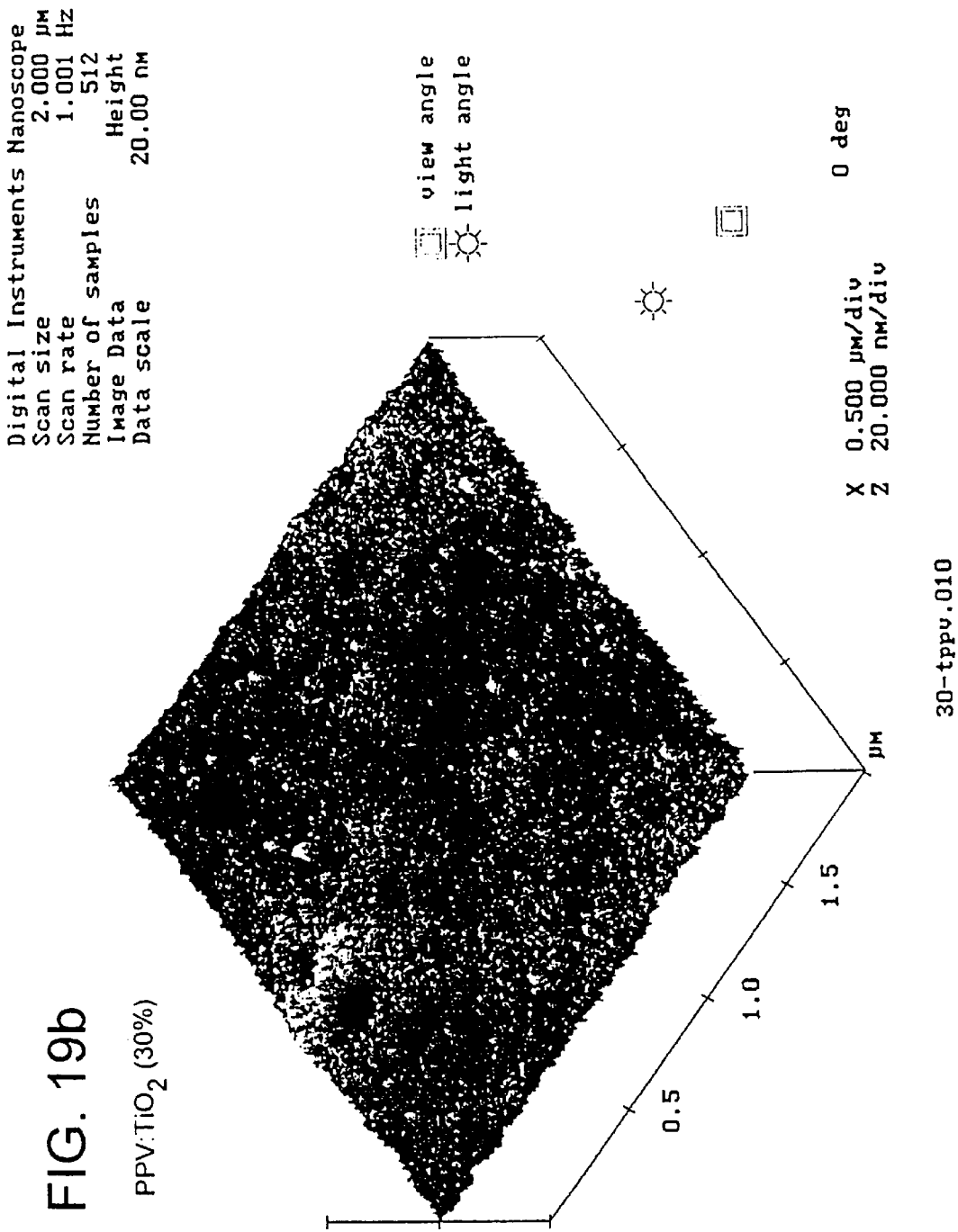

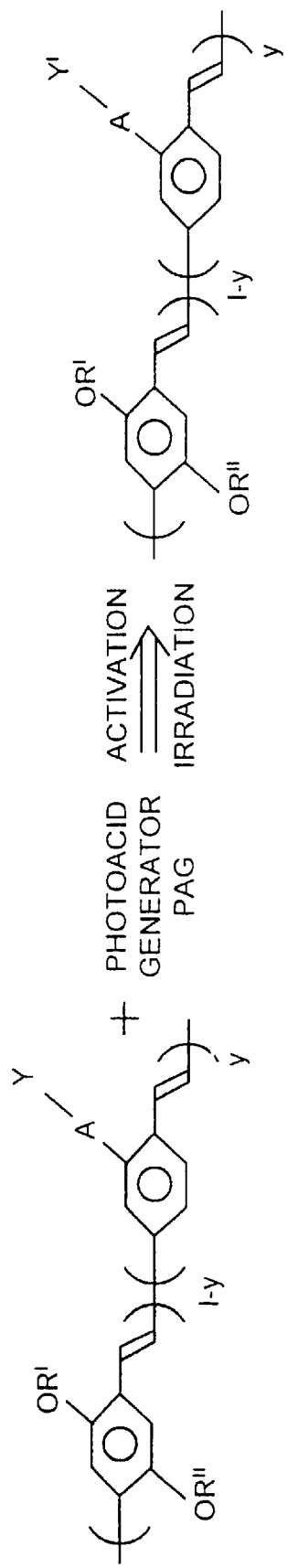
FIG.25
FIG.26
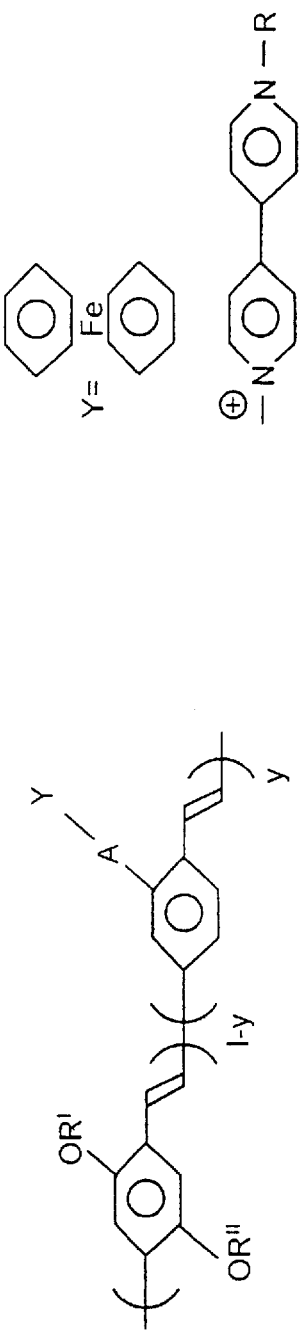

OPTICAL DEVICES

FIELD OF THE INVENTION

This invention relates to optical devices, especially devices comprising particles.

BACKGROUND OF THE INVENTION

Nanoparticles are particles of very small size, typically less than 100 nm across. The preparation of well-defined nanoparticles via colloid chemistry was demonstrated at least as early as the 1980s. A review of the current technology in this field is given in M P Pileni, Langmuir, 13, 1997, 3266–3279. There are three principal established routes for the formation of nanoparticles: a microemulsion route, a sol-gel route and a high temperature process used principally for semiconducting nanoparticles such as CdSe.

The synthetic principles of microemulsions have been widely described in the literature. For recent work see for example: F. J. Arriagada and K. Osseo-Asare, "Synthesis of Nanosized Silica in Aerosol CT Reverse Microemulsions," Journal of Colloid and Interface Science 170 (1995) pp. p17; V. Chhabra, V. Pillai, B. K. Mishra, A. Morrone and D. O. Shah, "Synthesis, Characterization, and Properties of Microemulsion-Mediated Nanophase $TiO_2$ Particles," Langmuir 11 (1995) pp. 3307–3311; H. Sakai, H. Kawahara, M. Shimazaki and M. Abe, "Preparation of Ultrafine Titanium Dioxide Particles Using Hydrolysis and Condensation Reactions in the Inner Aqueous Phase of Reversed Micelles: Effect of Alcohol Addition," Langmuir 14 (1998) pp. 2208–2212; J. Tanori and M. P. Pileni, "Control of the Shape of Copper Metallic Particles by Using a Colloidal System as Template," Langmuir 13 (1997) pp. 639–646. A microemulsion is a sufficiently thermodynamically stable solution of two normally immiscible liquids (for example, oil and water) consisting of nanosized droplets (or cores) of one phase in another "continuous" phase, stabilised by an interfacial film of a surfactant with or without a co-surfactant. Examples of surfactants include ionic ones such as Aerosol OT and cetyldimethylethylammonium bromide, and non-ionic ones such as the polyoxyethylene ether and ester surfactants. Examples of co-surfactants include medium to long alkyl-chain alcohols such as 1-hexanol. Examples of oils include hydrocarbons such as cyclohexane and isooctane. The surfactant and co-surfactant molecules reduce the interfacial tension so that stable dispersions can be formed.

Forming nanoparticles by the microemulsion route typically involves preparing a reaction mixture as a water-in-oil reverse micellar system using a ternary phase mixture containing high oil and surfactant contents, but low water content. This allows discrete but thermodynamically-stable nanometer-sized "water pools" or "water cores" to develop in the reaction mixture. In a typical water-in-oil microemulsion, the water cores are around 1 to 10 nm in diameter. One reactant for the nanoparticle formation can be initially housed in these water cores. The second reactant can subsequently diffuse into and react inside these "nano-reactors" in the normal course of microemulsion dynamics. In this way, microemulsions provide a versatile route to the controlled synthesis of a wide array of oxide and non-oxide types of nanoparticle. In the water pools a metal salt can be reduced to the free metal, or metathesis reactions can be included, to obtain a controlled nucleation and growth of the desired nanoparticle material. The surfactant also acts as a coating to prevent unwanted flocculation (agglomeration) of the growing particles. Many of the fundamental principles governing such micellar chemistry, such as reaction rate and final growth size, are still largely unknown. Most experiments are done by trial-and-error and the data interpreted empirically.

Much of the work on nanoparticles has concentrated either: (i) on demonstrating that nanometer-sized particles have indeed been created (for instance by using transmission electron microscopy (TEM) or ultraviolet-visible (UV-Vis) spectroscopy); or (ii) on subsequently sintering the nanoparticles to prepare a sintered body. This work has involved relatively crude techniques for handling the nano-sized material. For aspect (i) there has generally been no need to isolate or further manipulate the nano-size material. For aspect (ii) the formed material has typically been recovered from the emulsion by bulk precipitation upon addition of a destabilising solvent, or by vacuum removal of the reaction solvent. The material is then sintered at high temperatures to obtain the desired nano-grained article after "burning off" of the surfactant coating. Since the particles are to be sintered into a solid mass there is no need to counteract their tendency to aggregate.

Some work has been done on other uses for nanoparticles. S Carter, J C Scott and P J Brock, Appl. Phys. Lett, 71, 1997, 1145–1147 describe the use of polydispersed $TiO_2$, $SiO_2$ and $Al_2O_3$ nanoparticles in the form of a blend in polymer LED devices with the aim of enhancing the forward emission of light generated in the LED and/or improving carrier injection and recombination. The route by which the nanoparticles are obtained is not described, but the particles are described as having relatively large sizes: 30 to 80 nm, especially in comparison to the device thickness of 110 nm. It appears from the presence of light scattering that the nanoparticle material suffers from agglomeration. Thus the nanoparticular nature of the material cannot be fully exploited.

In some other works, for instance V. L. Colvin, M. C. Schlamp & A. P. Alivisatos Nature 370, 6488 (1994) "Light-emittng-diodes made from cadmium diselenide nanocrystals and a semiconducting polymer", the use of CdSe nanocrystals as a form of transport layer (deposited neat either by spin-coating or electrostatic self-assembly) in a multilayered device with organic light-emitting polymers has also been described. Another reference relating to nanoparticle polymer composites is J. Schmitt, G. Decher, W. J. Dressick, S. L. Brandow, R. E. Geer, R. Shashidhar, and J. M. Calvert, "Metal nanoparticle/polymer superlattice films: fabrication and control of layer structure," Adv. Mater., vol. 9, pp. 61, 1997.

Organic materials are used for a wide range of applications, including the formation of light emissive devices (see PCT/WO90/13148 and U.S. Pat. No. 4,539, 507, the contents of both of which are incorporated herein by reference). There is often a need to tune the properties of such an organic material. For example, in the manufacture of optoelectronic devices there is a need for control over various properties of the materials to be used, including conductivity (and/or mobility), refractive index, bandgap and morphology. Some examples of known techniques for tuning various properties are as follows:

1. Conductivity. This has been tuned by adding a chemical compound that acts as a donor or acceptor (namely an electronic dopant), see C. K. Chiang, C. R. Fincher, Y. W. Park, A. J. Heeger, H. Shirakawa, E. J. Louis, S. C. Gau, and A. G. MacDiarmid, "Electrical Conductivity in Doped Polyacetylene," Phys. Rev. Lett., vol. 39, pp. 1098–1101, 1977.

2. Charge generation and photo-voltaic response. This has been tuned by blending two materials with appropriate electronic levels so that electrons prefer to reside on one and holes on the other. The blends have been either of two organic materials such as polymers (J. J. M. Halls, C. A. Walsh, N. C. Greenham, E. A. Marseglia, R. H. Friend, S. C. Moratti, and A. B. Holmes, Nature 376, 498 (1995), "Efficient photodiodes from interpenetrating polymer networks") or of organic material with a nano-particle (N. C. Greenham, X. G. Peng, and A. P. Alivisatos, "Charge separation and transport in conjugated-polymer/semiconductor-nanocrystal composites studied by photoluminescence quenching and photoconductivity ," *Phys. Rev. B—Cond. Matt.*, vol. 54, pp. 17628–17637, 1996) to achieve exciton dissociation at the interface.

3. Band-gap and emission colour. This has been tuned by mixing organic compounds in the form of blends or co-polymers (see co-pending UK patent application number 9805476.0).

4. Scattering. Highly aggregated or very large size particles have been blended into polymers to take advantage of multiple internal light-scattering so as to increase the effective length the light travels within the polymer and hence, enhance amplified stimulated emission processes (F. Hide, B. J. Schwartz, M. A. Diazgarcia, and A. J. Heeger, "Laser-emission from solutions and films containing semiconducting polymer and titanium-dioxide nanocrystals," *Chem. Phys. Lett.*, vol. 256, pp. 424–430, 1996). Scattering might have also been used to enhance external efficiency of LEDs (S Carter, J C Scott and P J Brock, Appl. Phys. Lett, 71, 1997, 1145–1147).

SUMMARY OF THE INVENTION

According to a first aspect of the present invention there is provided a method for preparing nanoparticles for use, from a mixture of nanoparticles with another material, the method comprising washing the mixture with a solvent in which the nanoparticles are soluble to remove the said other material and form a solution of nanoparticles in the solvent. The solvent is preferably one in which the said other material is not soluble. Alternatively, the solvent may be one in which the other material is soluble but the nanoparticles are not.

The method preferably comprises separating at least a first fraction of the nanoparticles from a mixture of the solvent and the said other material. These separated nanoparticles may then be used, for example in the applications described below. These nanoparticles are preferably only weakly bound (e.g. unaggregated or only weakly aggregated), and not strongly bound, so that they suitably exist in a disaggregated state. This can assist in subsequent processing steps, such as forming a substantially uniform dispersion of the nanoparticles in another material. The solvent is preferably one that is capable of holding the dissolved nanoparticles in a disaggregated state.

The method preferably includes a step of maintaining the pH of the solvent at a predetermined level. This suitably maintains a charge on the nanoparticles. An acid or a base and/or a suitable buffer may be added to the solvent to maintain the desired pH.

The method preferably includes dialysis through a suitable membrane to remove soluble low molecular weight material (for example surfactant molecules) from the nanoparticle solution. Continuous or intermittent sonification could be performed during dialysis.

The separation may be performed by filtration and/or dialysis and/or centrifugation. Preferably the separation step or another step of the method also allows for the separation of the said first fraction of the nanoparticles from another fraction of the nanoparticles. For example, the nanoparticles of the said other fraction may be a set of particles that are relatively small in comparison to the nanoparticles of the first fraction. Thus, the separation step may also serve to narrow the size distribution of the retained nanoparticles.

The said other material may be a by-product of the formation of the nanoparticles, (examples include reaction products from the formation of the nanoparticles) and materials used to maintain process conditions during the formation of the nanoparticles, such as surfactants which could have been used in a microemulsion process for forming the nanoparticles.

The solvent may be an organic or an inorganic solvent. The solvent may be a polar solvent such as water or methanol (which may improve the solubility of the nanoparticles with polar surfaces) or a non-polar solvent. The solvent may be a polar non-hydrogen bonding solvent. It is preferred that the said other material is soluble in the solvent, and most preferably that the solvent is one in which the said other material is preferentially soluble to the nanoparticles. This can assist in the separation of the components.

The size range of the nanoparticles is preferably, but not necessarily, within the range from 1 nm to 100 nm. Preferably all or substantially all of the nanoparticles are smaller than 50 nm, 30 nm or 10 nm in diameter. Preferably all or substantially all of the nanoparticles are larger than 1 nm, 5 nm or 10 nm in diameter.

The method preferably comprises surface modifying the nanoparticles. This may suitably be achieved by adsorbing a material to the surface of the particles. The material may be added as surface modifying agent to the solution of nanoparticles. The material may, for example, be a silylating agent or a dye or a chemical functional material. The material may promote specific interactions with other materials such as polymers. Alternatively, or additionally, the nanoparticles may already have a surface coating. This may be a coating of a surfactant.

The nanoparticles may be of metallic, semiconducting or insulating material. Examples of suitable materials include inorganic oxides such as $SiO_2$, $TiO_2$, $Al_2O_3$ or $ZrO_2$, or ternary or other binary inorganic materials such as $BaSO_4$, $YbF_3$, ZnS or other organic materials, especially polymer materials, such as PTFE, polymethytmethacrylate (PMMA) or polystyrene (PS). The nanoparticles are preferably light transmissive and most preferably optically transparent. Therefore, the material of which the nanoparticles are formed is preferably a wide optical bandgap material.

The nanoparticles may have been formed by any suitable route. Examples include the microemulsion route and the sol-gel route.

A further step in the processing of the nanoparticles is preferably to incorporate them into a body of material. To achieve this the material of the body, or a precursor of it, is preferably added to the solution of nanoparticles. A uniform (or substantially uniform) non-aggregated (or substantially non-aggregated) dispersion of the nanoparticles in the final body is achieved by ensuring that they are held in a substantially disaggregated state until fixed in place in the body, e.g. by removal of the solvent by a step such as evaporation, it is therefore preferable that the material of the body (or its precursor) is soluble in the solvent in which the nanoparticles are dissolved, and does not have undesirable interactions with the nanoparticles that may lead to severe aggregation or phase separation.

The material of the body could be (but need not be) an organic material. Examples are polymers, oligomers and materials of small organic molecules. If the material is a polymer material it may be a conjugated polymer such as poly(p-phenylenevinylene) (PPV). Alternatives include poly (2-methoxy-5-(2'-ethyl)hexyloxyphenylene-vinylene) ("MEH-PPV"), a PPV-derivative (e.g. a di-alkoxy or di-alkyl derivative), a polyfluorene and/or a co-polymer incorporating polyfluorene segments, PPVs and/or related co-polymers, poly (2,7-(9,9-di-n-octylfluorene)-(1,4-phenylene-((4-secbutylphenyl)imino)-1,4-phenylene)) ("TFB"), poly(2,7-(9,9-di-n-octylfluorene)-(1,4-phenylene-((4-methyoxyphenyl)imino)-1,4-phenylene-((4-methylphenyl)imino)-1,4-phenylene)) ("PFM"), poly(2,7-(9,9-di-n-octylfluorene)-(1,4-phenylene-((4-methoxyphenyl) imino)-1,4-phenylene-((4-methoxyphenyl) imino)-1 ,4phenylene)) ("PFMO"), F8 or F8BT. Alterative materials include organic molecular materials such as Alq3. The material is suitably light-transmissive and/or light-emissive.

The presence of the nanoparticles (including optionally any material attached to the surface of the nanoparticles) in the material of the body preferably influences at least one material property of the material of the body. This could be an optical property such as refractive index or an electrical property such as conductivity. Thus the nanoparticles could be dispersed in the material of the body to tailor its refractive index—either increasing or decreasing it depending on the relative refractive indices of the material of the body and the nanoparticles. The presence of the nanoparticles, and the interaction between the nanoparticles and the polymer (including optionally any material attached to the surface of the nanoparticles) in the material of the body could also influence the morphology of the material of the body, for instance by inhibiting crystallisation.

The volume fraction of the nanoparticles in the body is preferably greater than 1, 5 or 10 volume %. The volume fraction of the nanoparticles in the body is preferably less than 50, 30 or 30 volume %. The density of the nanoparticle distribution in the body is preferably greater than $10^{-17}$ and/or less than $10^{-19}/cm^2$.

It is preferred that the nanoparticles exist in the body in a disaggregated state. This suitably promotes uniformity of the properties in the body. Furthermore, in some circumstances aggregates of the particles could scatter incident light, and it is preferred that the particles are of a sufficiently small size and disaggregated nature that they substantially do not scatter incident light.

The body could be a layer of a device such as an electronic and/or optical device. Preferred non-limiting examples of such devices are as follows:

1. A device comprising a stack of layers defining a light-reflective structure, with at least one of the layers comprising a dispersion of nanoparticles as described above. Preferably alternating layers of the device comprise a dispersion of nanoparticles as described above. This device is suitably a distributed Bragg reflector.

2. A light emissive device in which a light emissive layer or a layer adjacent to the light emissive layer comprises a dispersion of nanoparticles as described above. In this case the nanoparticles may carry a fluorescent dye (suitably as a surface layer).

This dye can suitably be stimulated to fluoresce by energy transfer or light emission from the emissive layer; thus the dye can act to modify the colour of light emission from the emissive layer. The device may also comprise a waveguide structure defined by a relatively high refractive index layer located between two relatively low refractive index layers. One of those three layers preferably comprises a dispersion of nanoparticles as described above which suitably modifies its refractive index to help define the waveguide structure. The waveguide is preferably located outside and/or separately from and/or independent of the light-emissive region of the device (the energy level profile of the device may be arranged to encourage light emission other than in the waveguide). This can permit independent tuning of the material properties of the emissive layer and the waveguide layer. The device may have a pair of mirrors located on either side of it—either mirrors of the type described for device 1 above or mirrors of another type such as cleavage surfaces. These mirrors may define a microcavity which can spectrally redistribute light generated by the device. The device may be a laser, for instance a microcavity or waveguide laser. A mirror could be provided by a DBR grating superimposed on the waveguide structure (on a substrate or any subsequent layer).

Thus according to another aspect of the present invention there is provided a reflective structure (preferably a distributed Bragg reflector) comprising a plurality of layers having alternating refractive indices, each layer comprising a substantially uniform dispersion of nanoparticles. According to another aspect of the present invention there is provided a light-emitting device comprising a light-emitting layer comprising a substantially uniform dispersion of fluorescent nanoparticles. The light-emitting layer preferably comprises an organic material, most preferably a conjugated polymer material. According to another aspect of the invention there is provided a light-emitting device comprising a light-emitting layer located between two waveguide layers having a lower refractive index than the light-emitting layer, and wherein the light-emitting layer and/or the waveguide layers comprises a substantially uniform dispersion of nanoparticles. It will be appreciated that such devices may include any suitable additional features as described herein.

Other aspects of the present invention include any or all of the articles described above. For example, according to a further aspect of the present invention there is provided an optical and/or electronic device including any of the features described above. According to a further aspect of the invention there is provided a method for forming an optical and/or electronic device including any of the features described above. According to a further aspect of the invention there is provided a solution of nanoparticles in other than a strongly bound state, suitably including any of the features described above. According to a further aspect of the invention there is provided a solution of a polymer material (or a polymer precursor material) and nanoparticles in other than a strongly bound state. According to a further aspect of the invention there is provided an organic material containing a substantially uniform dispersion of nanoparticles; preferably the organic material is a semiconductive and/or a polymer material. According to a further aspect of the invention there is provided a method for tailoring at least one property of an organic material, the method comprising forming a substantially uniform dispersion of nanoparticles in the material.

According to a further aspect of the present invention there is provided an optical device comprising a reflective structure having a plurality of layers, each layer comprising a semiconductive conjugated polymer, the refractive indices of adjacent ones of the layers being different. At least one of the layers may comprise a substantially uniform dispersion of light transmissive nanoparticles. At least one of the layers may comprise a partially doped semiconductive conjugated polymer. The semiconductive conjugated polymer is preferably doped in an amount less than one tenth of that which would be required to fully dope the semiconductive conjugated polymer. The plurality of layers may define a distributed Bragg reflector or another photonic structure. The device may comprise a light-emitting region and a pair of electrodes arranged so that the said plurality of layers and the light-emitting region are located between the electrodes. Then, the light-emitting region may be driven to emit light by the application of a voltage between the electrodes, current flowing through the said plurality of layers.

One or more layers of an optical device according to an aspect of the present invention may be formed by a method of forming a partially doped polymer material that comprises: adding a doping agent to the polymer or a precursor thereof, the doping agent being capable of bonding to the precursor or the polymer chain; and causing the doping agent to leave the precursor or the polymer chain to form a dopant capable of doping the polymer chain; wherein fewer moles of the doping agent are added than would be numerically sufficient to fully dope the polymer chain, thus forming a partially doped polymer material. The doping agent may bond to the precursor or polymer chain by replacing a leaving group on the chain. The step of causing the doping agent to leave the polymer chain may be effected by heating. The step of causing the doping agent to leave the polymer chain may result in conjugation of the polymer and/or formation of the polymer from the precursor. The method preferably also includes the step of causing the dopant to dissociate, for example by the application of light and/or heat. The conductivity of the polymer after doping is suitably less than $10^{-3}$ S/cm, preferably less than $10^{-4}$ S/cm or $10^{-5}$ S/cm, and most preferably in the range from $10^{-9}$ S/cm to $10^{-13}$ S/cm. The amount of dopant that is added is preferably an effective amount to achieve a conductivity in such a range. The polymer after doping is preferably partially conducting. The polymer after doping is preferably partially semi-conducting. A photonic device formed in this way may include a plurality of layers of such doped materials, the layers alternating in their levels of doping. The device could be a mirror, for instance a distributed Bragg reflector.

BRIEF DESCRIPTION OF THE DRAWINGS

The present invention will now be described by way of example with reference to the accompanying drawings, in which:

FIG. 17b shows the refractive indices (n) and energy levels (E) through the device of FIG. 17a;

FIG. 19b shows the result of atomic force microscopy of a PPV:$TiO_2$ film with 30% vol. $TiO_2$;

FIGS. 21 to 26 show routes for doping polymers; and

DETAILED DESCRIPTION

Figure 1:
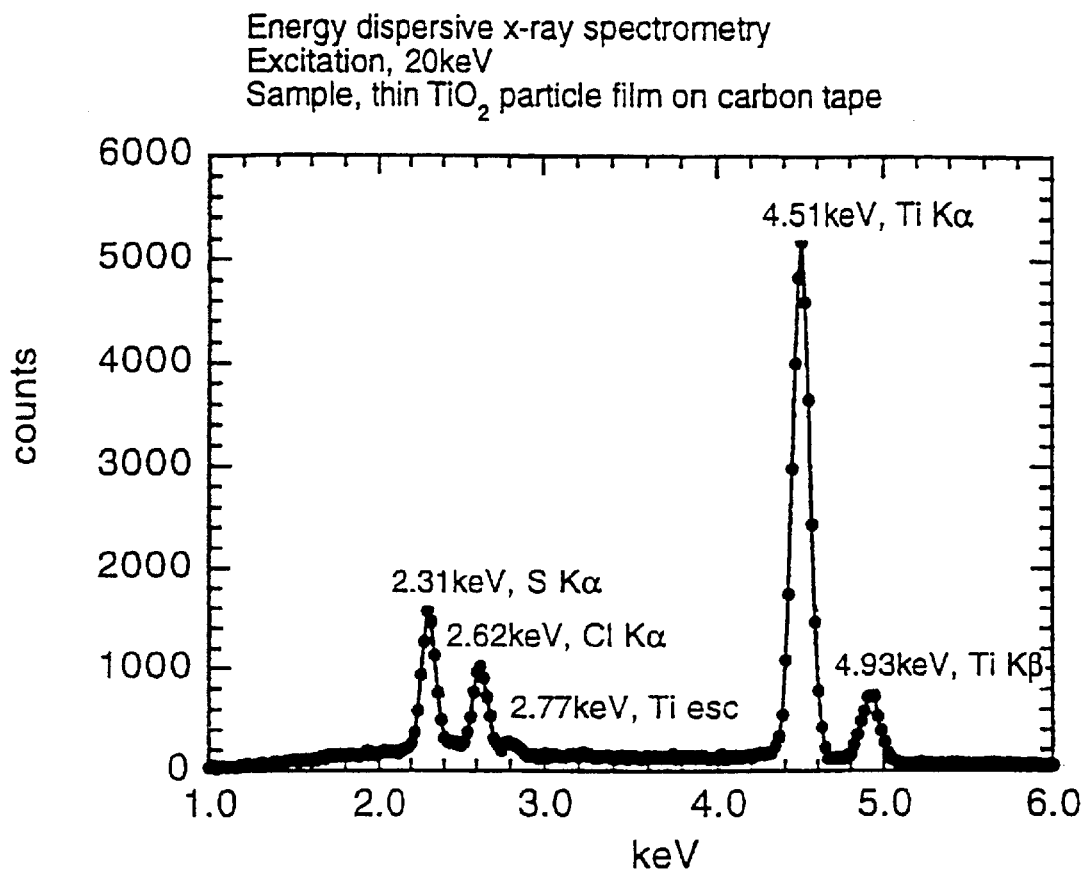
FIG. 1 shows the results of energy dispersive X-ray spectrometry of $TiO_2$ nanoparticles.

Processes for the formation of nanoparticles, together with some exemplary applications for those nanoparticles (or for other suitable nanoparticles), will now be described. The processes allow for the formation of nanoparticles in a sufficiently non-aggregated state that they can be dispersed relatively evenly into a matrix such a polymer body. In that state the nanoparticles can be employed to tailor the properties of the matrix in desired ways.

Processes for the synthesis and isolation of $TiO_2$ and $SiO_2$ nanoparticles will be described. These processes can readily be extended to the synthesis and isolation of nanoparticles of other materials, including metallic and semiconductive materials.

Synthesis of $TiO_2$ Nanoparticles

As a first step, a microemulsion of $H_2O+NH_3/AOT/$ cyclohexane was prepared. To prepare the microemulsion 17.2g of finely divided sodium dioctylsulfosuccinate (AOT) (39 mmol, Aldrich) was dried at 120° C. in a vacuum oven for 2 h to remove adsorbed moisture (3% weight loss), and then added to 200 ml of HPLC grade cyclohexane (Aldrich) in a three-necked round bottom flask quipped with a magnetic stirrer to give a 0.2M AOT solution. Then 3.8 ml of concentrated aqueous $NH_3$ (35 w/v %, Aldrich) was added to this solution to give a $H_2O:NH_3:AOT$ molecular ratio of 1.8:3.2:1.0 and the solution was cooled to 5° C. under $N_2$ flow in an ice-bath to give an optically clear single-phase microemulsion. The total molar ratio of $H_2O+NH_3$:AOT (5.0:1.0) fixed the radius of water cores in the emulsion at around 25 Å (F. J. Arriagada and K. Osseo-Asare, "Synthesis of nanosize silica in Aerosol OT reverse microemulsions", Journal of Colloid and Interface Science 170 (1995), pp. 8–17).

To prepare a $TiO_2$ precursor solution, 2.0 ml $TiCl_4$ (18 mmol, Aldrich) was added by syringe into 10 ml HPLC grade cyclohexane (previously dried for 18 h over 3 Å molecular sieves, Aldrich) in a vial equipped with a rubber septum. This TiO$_2$ precursor solution was added in two portions to the AOT solution with vigorous stirring. Rapid evolution of HCl gas was observed together with the formation of a cloudy suspension of NH$_4$Cl in the reaction medium, according to the following equations:

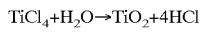

TiCl$_4$+H$_2$O→TiO$_2$+4HCl

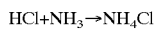

HCl+NH$_3$→NH$_4$Cl

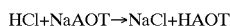

HCl+NaAOT→NaCl+HAOT

After half an hour, the bath temperature was raised to and then maintained at 80° C. for 3 h to complete the reaction, and finally cooled to room temperature overnight.

The amount of H$_2$O in the reaction medium (120 mmol) was well in excess of the amount needed to hydrolyse the TiCl$_4$. However, the amount of NH$_3$ was not sufficient to neutralise all the HCl produced, so the reaction medium became acidic and a positive surface charge developed on the TiO$_2$ nanoparticles. (The iso-electric point of bulk TiO$_2$ is about pH 4 to 5).

Isolation of TiO$_2$ Nanoparticles

The cyclohexane solvent was slowly evaporated away to give a cloudy, viscous gel containing the TiO$_2$ and NH$_4$Cl by-product. 20 ml HPLC-grade CHCl$_3$ (Aldrich) was added to this gel to precipitate out the NH$_4$Cl and NaCl which could then be readily separated from the clear supernatant by centrifugation. Electron beam elemental analysis by energy dispersive x-ray spectrometry (EDX) of the CHCl$_3$ supernatant gave no detectable Cl (the height of the Cl K$\alpha$ peak was less than 1% of the height of the Ti K$\alpha$ peak), indicating it was essentially free from contamination by the chlorides. The CHCl$_3$ supernatant was then concentrated in vacuo to give a viscous gel which was then taken up in 25 ml MeOH to give the crude TiO$_2$-containing liquor.

To purify the TiO$_2$ further from excess AOT, 10 ml of the crude liquor was placed in a 6–8 k MWCO cellulose dialysis tubing (Spectra/Por®) and dialysed against twice-daily refreshed 200 ml quantities of HPLC grade MeOH each containing 0.3 ml concentrated aqueous HCl. The Ti, S and Cl content of both the dialysate and retentate were monitored daily by EDX, and the dialysis was stopped when the Ti and S signals in the dialysate fell below that of Cl (which was treated as indicating a background level). This dialysis, in addition to removing the excess AOT contamination, also improved the size distribution of the particles by removing the smallest particles, which could readily pass through the pores of the dialysis tubing. In this way, an optically clear dispersion of about 0.9 w/v % TiO$_2$ in a MeOH solution of pH=2 was obtained. The TiO$_2$ nanoparticles at this point were para-crystalline and coated by a monolayer of surfactant derivative.

Characterisation of TiO$_2$ Nanoparticles

Figure 2:
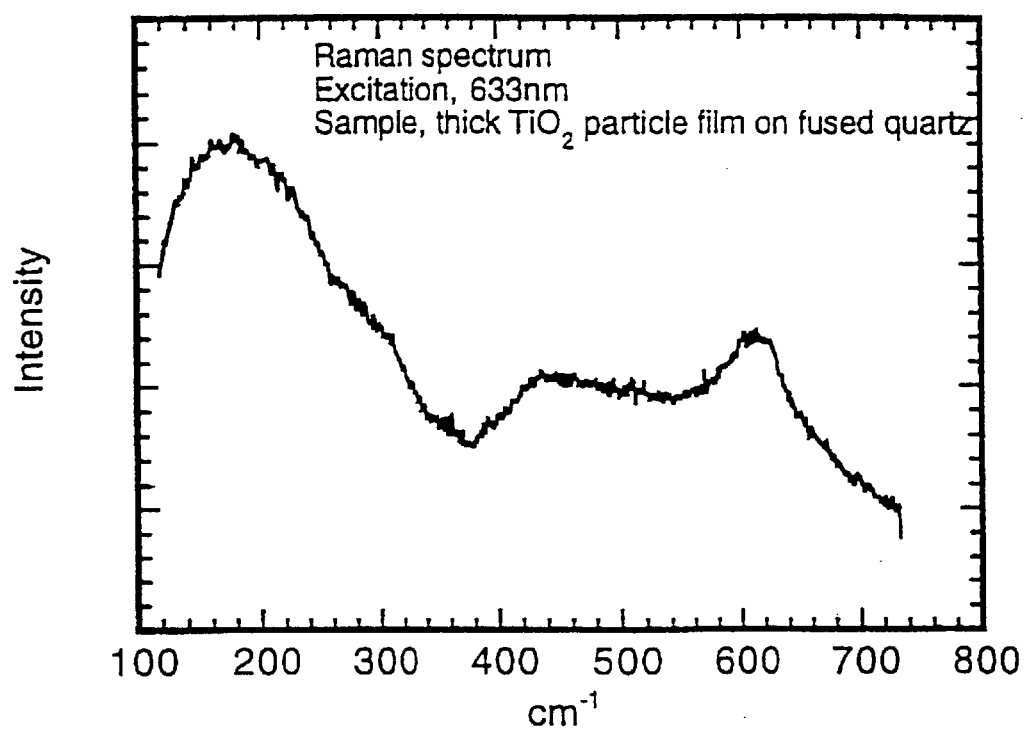
FIG. 2 shows the results of Raman spectroscopy of $TiO_2$ nanoparticles.

Electron probe energy dispersive x-ray spectrometry (see FIG. 1) shows the final product to be pure TiO$_2$ with a surface coating of AOT and Cl. It is believed that the AOT (which is the origin of the S signal) is strongly absorbed onto the TiO$_2$ surface while Cl is believed to have existed in the form of Cl$^-$ acting as a weakly-bound counterion for the positively-charged TiO$_2$ surface. This coating appears to be stable against further dialysis. Raman spectroscopy (see FIG. 2) confirms the structure as being that of TiO$_2$, with broad vibration peaks at 170 cm$^{-1}$, 440 cm$^{-1}$ and 610 cm$^{-1}$.

Figure 3:
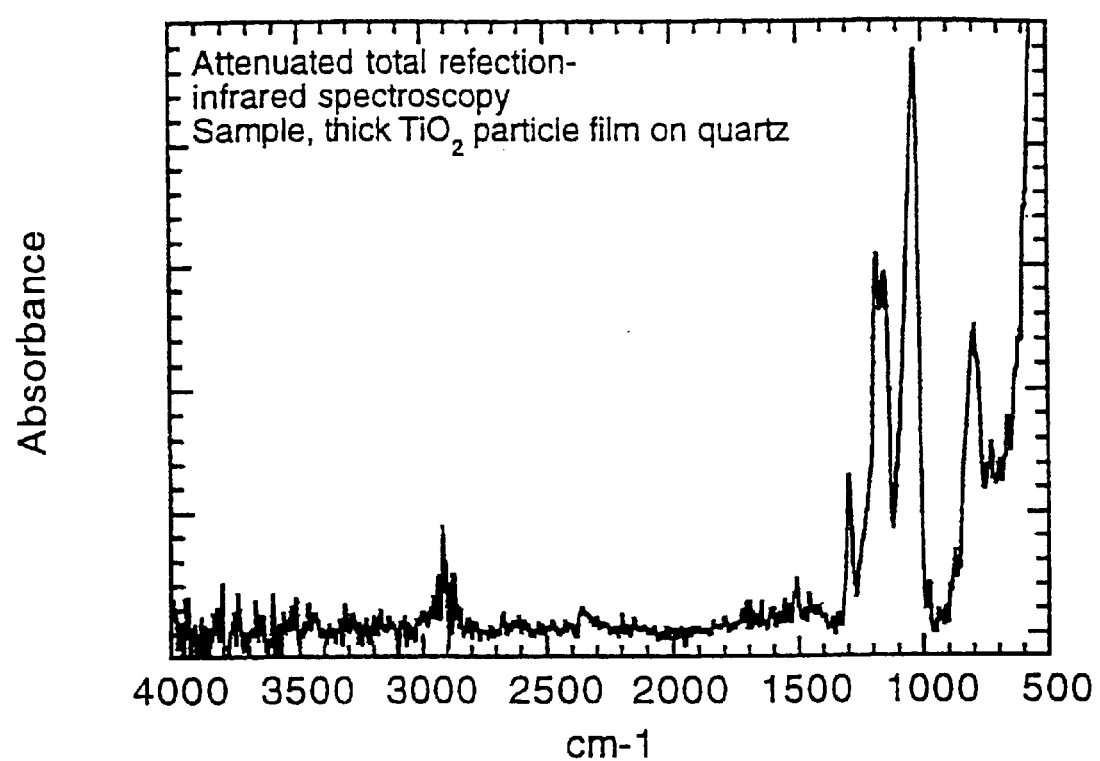
FIG. 3 shows the results of attenuated total reflection infrared spectroscopy of $TiO_2$ nanoparticles.
Figure 4:
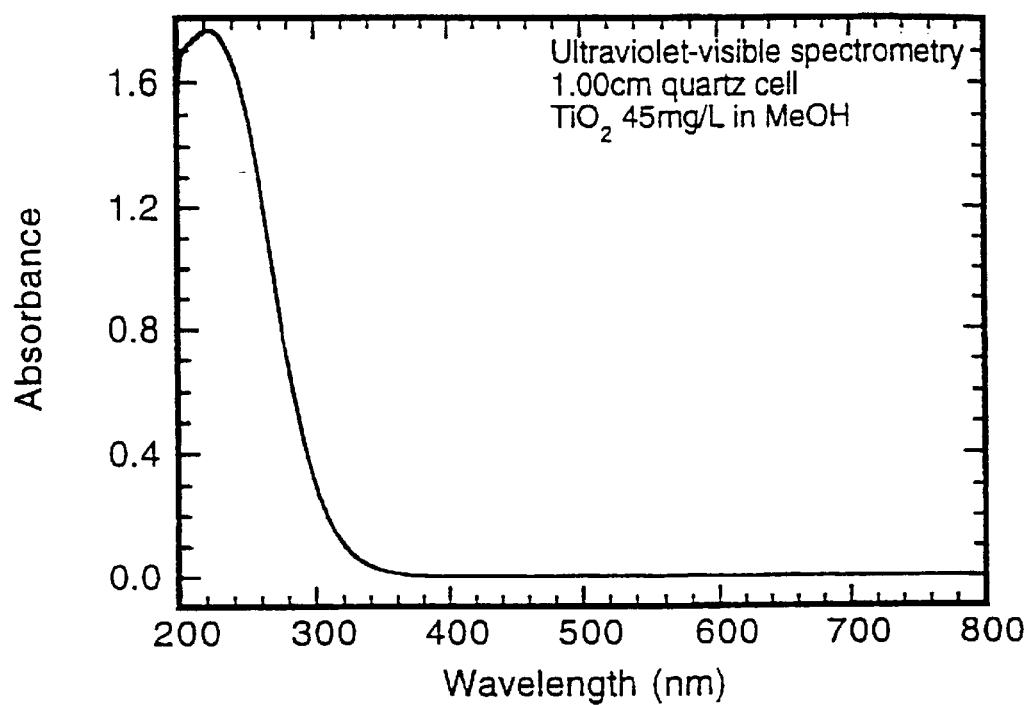
FIG. 4 shows the UV-Vis spectrum of $TiO_2$ nanoparticles.
Figure 5:
FIG. 5 shows the results of transmission electron microscopy of $TiO_2$ nanoparticles deposited as a film.
Figure 6:
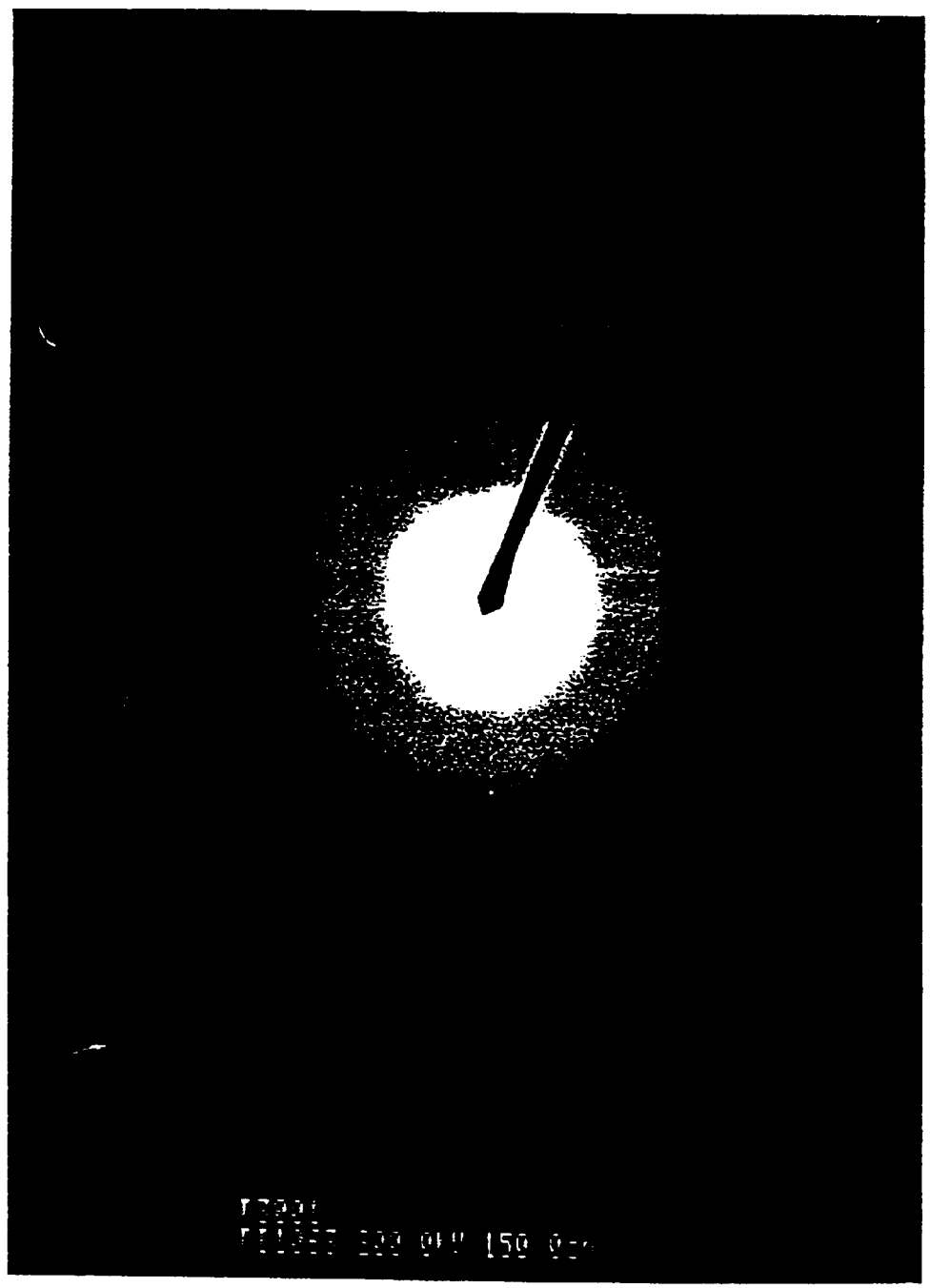
FIG. 6 shows an electron diffraction pattern for $TiO_2$ nanoparticles.

Attenuated total reflection Fourier-transformed infrared spectroscopy (see FIG. 3) provides further confirmation of structure. Ultraviolet-visible spectrometry (see FIG. 4) shows the product to be non-scattering in the visible, and provides evidence for the highly dispersed (non-aggregated) nature of the TiO$_2$ nanoparticles achieved via the above described synthesis and isolation. Transmission electron microscopy (see FIG. 5) shows that a particle size of 2–8 nm has been achieved, while electron beam diffraction (see FIG. 6) gives the expected d-spacings for TiO$_2$.

Synthesis of SiO$_2$ Nanoparticles

An H$_2$O+NH$_3$/AOT/cyclohexane phase was prepared as described above.

To prepare a SiO$_2$ precursor solution, 2.1 ml SiCl$_4$ (18 mmol, Aldrich) was added by syringe into 10 ml HPLC grade cyclohexane (previously dried for 18 h over 3 Å molecular sieves, Aldrich) in a vial equipped with a rubber septum. This SiO$_2$ precursor solution was added in two portions to the AOT solution with vigorous stirring. Rapid evolution of HCl gas was observed together with the formation of a cloudy suspension of NH$_4$Cl in the reaction medium, according to the following equations:

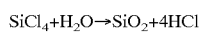

SiCl$_4$+H$_2$O→SiO$_2$+4HCl

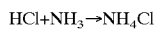

HCl+NH$_3$→NH$_4$Cl

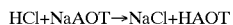

HCl+NaAOT→NaCl+HAOT

After half an hour, the bath temperature was raised to and then maintained at 80° C. for 3 h to complete the reaction, and then cooled to room temperature overnight.

The amount of H$_2$O in the reaction medium (120 mmol) was well in excess of the amount needed to hydrolyse the SiCl$_4$.

Isolation of SiO$_2$ Nanoparticles

The cyclohexane solvent was slowly evaporated away to give a cloudy, viscous gel containing the SiO$_2$ and NH$_4$Cl (together with NaCl) by-product. Then 20ml HPLC-grade CHCl$_3$ (Aldrich) was added to this gel to precipitate out the SiO$_2$ together with NH$_4$Cl and NaCl by-product as a slurry which could then be readily separated from the clear supernatant which contained mainly excess AOT by centrifugation. EDX of the CHCl$_3$ supernatant gave no detectable Si (the height of the Si K$\alpha$ peak was less than 1% of the height of the S K$\alpha$ peak), indicating that it was essentially free from SiO$_2$. The CHCl$_3$ supernatant was then removed, and the slurry washed (with sonication) in several 25 ml lots of HPLC-grade MeOH to remove as much NH$_4$Cl and NaCl by-product as possible. After each washing the amount of SiO$_2$ in solution was checked. After three washings the centrifugate containing the SiO$_2$ was then taken up in 30 ml MeOH, to give the crude SiO$_2$ as a translucent gel.

To purify the crude SiO$_2$ further from the inorganic chlorides, 10 ml of the gel was placed in a 6–8k MWCO cellulose dialysis tubing (Spectra/Por®) and dialysed against two change of 200 mL HPLC grade MeOH containing 0.3 ml concentrated aqueous HCl. The retentate was then sonicated for 30 min to break up the weak SiO$_2$ aggregates and then dialysis continued with twice-daily refreshed MeOH+HCl. The appearance of the retentate became clear after a while. The Si, S and Cl content of the dialysate was monitored daily, and the dialysis was stopped when the Cl signal fell to and stabilised at about 1.7 times that of S (from the AOT) which acted as a background. Sonication could be performed during dialysis. This dialysis, in addition to removing the chloride and AOT contamination, also improved the size distribution of the particles by cutting off the smallest particles, which could readily pass through the pores of the dialysis tubing. The dialysis took three to five days. A further dialysis step, with a larger molecular weight cut-off tube, could be used to separate off the largest particles and thus give an even tighter size distribution.

In this way, an almost optically clear dispersion of $SiO_2$ of about 1.1 w/v % in a MeOH solution of pH=2 was obtained.

Characterisation of $SiO_2$ Nanoparticles

Figure 7:
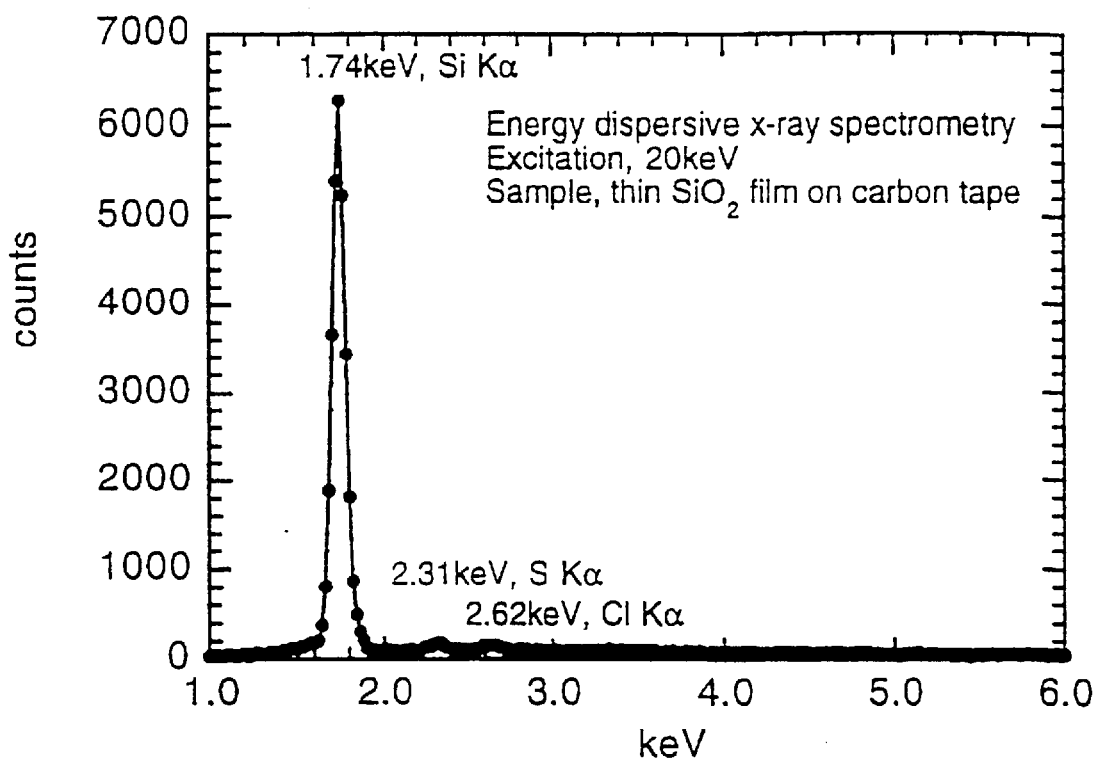
FIG. 7 shows the results of energy dispersive X-ray spectrometry of $SiO_2$ nanoparticles.
Figure 8:
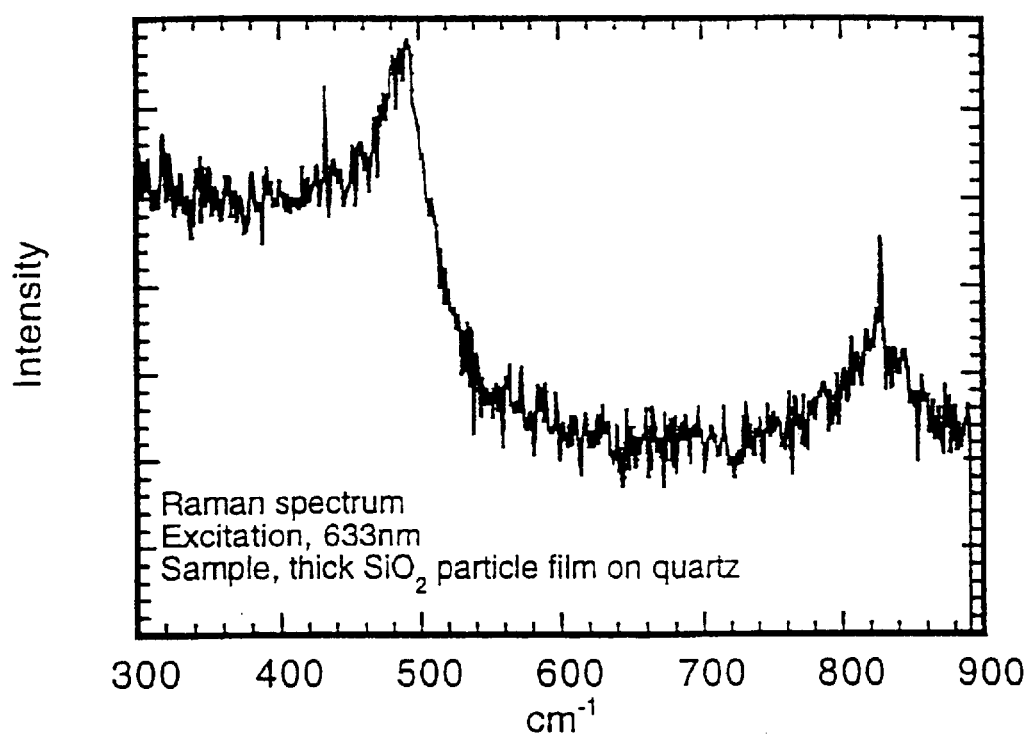
FIG. 8 shows the results of Raman spectroscopy of $SiO_2$ nanoparticles.
Figure 9:
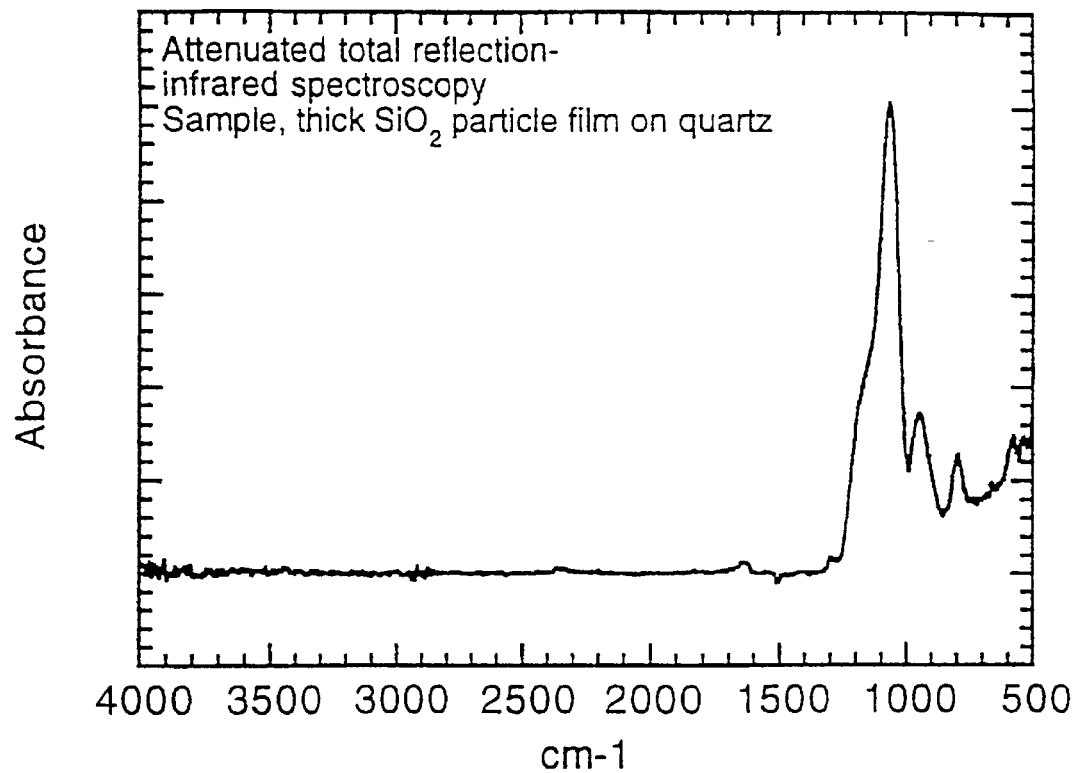
FIG. 9 shows the results of attenuated total reflection infrared spectroscopy of $SiO_2$ nanoparticles.
Figure 10:
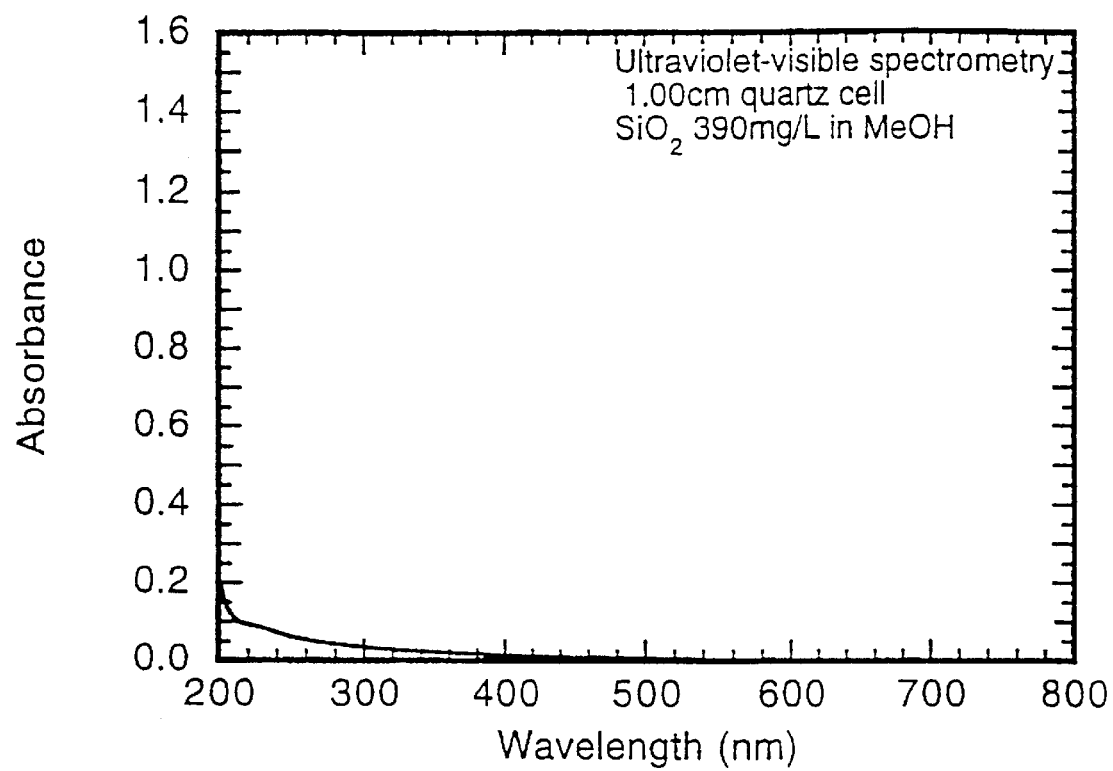
FIG. 10 shows the UV-Vis spectrum of $SiO_2$ nanoparticles.
Figure 11:
FIG. 11 shows the results of transmission electron microscopy of $SiO_2$ nanoparticles deposited as a film.
Figure 12:
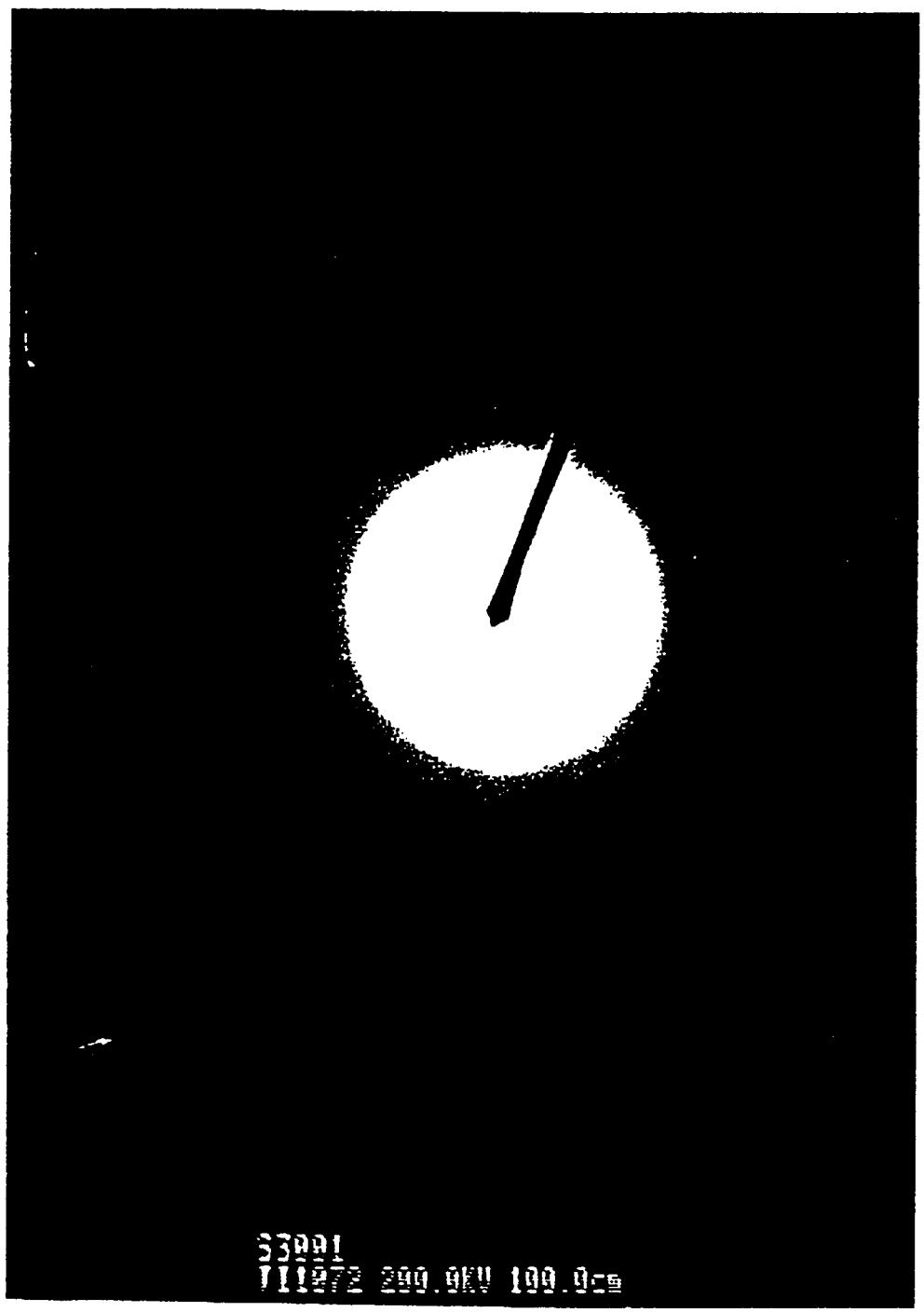
FIG. 12 shows an electron diffraction pattern for $SiO_2$ nanoparticles.

Electron probe energy dispersive x-ray spectrometry (see FIG. 7) shows the final product to be pure $SiO_2$ with essentially no surface coating. Raman spectroscopy (see FIG. 8) confirms the structure as being that of $SiO2$ with broad vibration peaks at 490 $cm^{-1}$, and 830 $cm^{-1}$. Attenuated total reflection Fourier-transformed infrared spectroscopy (see FIG. 9) provides further confirmation of structure. Ultraviolet-visible spectrometry (see FIG. 10) shows the product to be essentially non-scattering in the visible, providing evidence for the highly-dispersed (non-aggregated) nature of the $SiO_2$ nanoparticles achieved in the described synthesis and isolation. Transmission electron microscopy (see FIG. 11) shows that a particle size range of 2–8 nm was been achieved, while electron beam diffraction (see FIG. 12) gives the expected d-spacings for $SiO_2$.

General Nanoparticle Considerations

The nanoparticle synthesis process can be suited to formation of nanoparticles of a desired type by selection of the materials involved in the process, for instance the precursor materials and surfactant, and optimisation of chemical parameters such as oil composition, temperature, water-surfactant ratio, surfactant-oil ratio, co-surfactant composition and reactant ratio. Nucleation and growth of the particles could be monitored by TEM and/or UV-Vis spectroscopy to ensure suitable reaction rates and size distribution are achieved.

It is preferable that the steps be performed in a controlled atmosphere to minimise undesirable reaction in the nanoparticle solution. The temperature of the nanoparticle formation step could be fixed to favour the desired balance between nucleation and growth rates to give a preferred particle size distribution. It will be noted that the emulsion conditions described above have been chosen to yield especially small water cores.

The synthesis processes described above make use of the microemulsion route, which has been found generally to offer good control of particle nucleation, growth, aggregation, size distribution, and surface capping that could be judiciously exploited to tailor specific material and processing properties. As an alternative the nanoparticles could be synthesised by other routes, such as the sol-gel route based on direct hydrolysis in water or alcohols, (see for example T. Moritz, J. Reiss, K. Diesner, D. Su, and A. Chemseddine," Journal of Physical Chemistry B 101 (1997) pp. 8052–8053) and then isolated in a non-strongly aggregated state generally as described above.

Applications for the Nanoparticles

Some non-limiting examples of applications of the nanoparticles as prepared above will now be described. Nanoparticles prepared by other routes could be used in these applications, provided they were of the appropriate size and composition and had a level of disaggregation sufficient to allow them to be dispersed relatively uniformly in the polymer matrices.

Two general modes have been identified by which the nanoparticles can provide an effect in a host matrix material.

1. Non-interfering mode. The particles may be selected and/or treated so that they do not significantly alter the intrinsic properties of the host material. For most applications it would be preferred that such particles are of a size below around 20 nm (to allow them to be easily dispersed uniformly in the host) and above 5 nm (suitably to avoid them acting like molecules and possibly interfering with the host structure—for example by chain separation in a polymer matrix).

2. Interfering mode. The particles may be selected and/or treated so that they do interact significantly with the host material to affect its intrinsic properties. This may occur if:
   a. The particles themselves or especially their attached surface functions are of a material that interacts with the host material, through chemical or physical interactions. The particles may carry an additive agent that interacts with the host material, for example to change the chemical properties of the host (e.g. electrical/optical doping) and/or its physical properties (e.g. polarisation or alignment or energy transfer). The additive agent may be bound to the surface of the particles or at least partially included in the particles.
   b. The particles are sufficiently small and numerous that they significantly perturb the arrangement of the molecules in the body—for instance to affect the morphological structure of a polymer host (e.g. by perturbing the chain trajectories). Such particles could also change the environment of molecules of the host material (e.g. polymer chains) thus affecting many of its properties (band-gap, electron affinity, exciton binding, radiative lifetime etc.).

Examples 1, 2 and 3 below use nanoparticles predominantly in the non-interfering mode. Examples 4 and 5 use nanoparticles in the interfering mode.

EXAMPLE 1

Tuning of Polymer Film Refractive Index

In this example the refractive index of films of PPV is tuned by the addition to the film of a dispersion of $TiO_2$ nanoparticles. Since the nanoparticles are light transmissive and sufficiently small to avoid scattering of incident light the resulting film has good optical properties. Four samples of PPV containing varying amounts of 1O2 (referred to herein as "PPV:$TiO_2$") were fabricated by blending the appropriate volume of the 1.4 w/v % precursor PPV-MeOH solution (Cambridge Display Technology) with a 1.8 w/v % $TiO_2$-MeOH solution to give the same final concentration of precursor PPV but different concentrations of $TiO_2$. The size range of the $TiO_2$ particles was approximately 2–8 nm. A nominally 1000 Å film was obtained by spin-coating on to a glass substrate and then thermally-converted at 180° C. under dynamic vacuum (less than $10^{-5}$ mbar) for 8 h. The actual $TiO_2$ content in the film was measured by a combination of electron probe x-ray spectrometry (for $TiO_2$ content) and visible spectrometry (for PPV content) and the film thickness was measured by surface profilometer.

| Film | PPV:MeOH:TiO$_2$ Vol. Ratio | Measured TiO$_2$ Vol % in Final Film | Measured Refractive Index at 633 nm |
|---|---|---|---|
| A | 3:4:0 | 0 | 2.60 |
| B | 3:1:3 | 15 | 2.37 |
| C | 3:2:2 | 30 | 1.94 |
| D | 3:0:4 | 50 | 1.77 |

Figure 13:
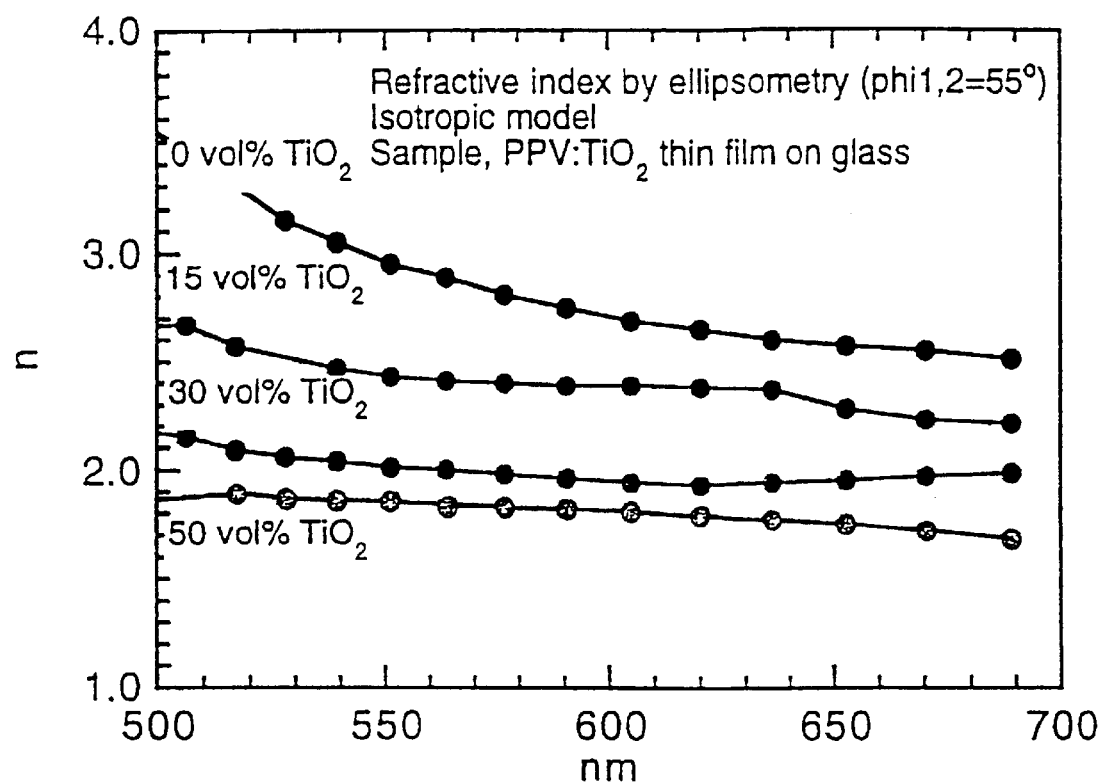
FIG. 13 plots refractive index measurements for PPV-:$TiO_2$ thin films.

The refractive indices of the films over the whole visible window were then measured by spectroscopic ellipsometry (see FIG. 13). Transmission spectrometry shows the resultant films to be highly non-scattering (scatter at 633 nm was estimated at less than 2%). These results demonstrate that high optical-quality organic films can be obtained using highly-dispersed nanoparticles as a refractive index modifier.

Similar results were obtained for samples of PPV blended with SiO$_2$ (PPV:SiO$_2$). In the films detailed in the following table, the precursor PPV and SiO$_2$ concentrations were both 1.1 w/v %. Nominally 1000 Å films were obtained by repeated spin-coating and conversion on glass substrates and then thermally-annealing at 160° C. under dynamic vacuum (less than 10$^{-5}$ mbar) for 8 h. The other experimental procedures were similar to those given earlier.

| Film | PPV:MeOH:SiO$_2$ Vol. Ratio | Measured SiO$_2$ Vol % in Final Film | Measured Refractive Index at 633 nm |
|---|---|---|---|
| E | 3:16.5:0 | 0 | 2.39 |
| F | 3:15.5:1 | 6 | 2.18 |
| G | 3:14.5:2 | 10 | 2.10 |
| H | 5:12:4 | 19 | 2.05 |

To further check the effect on refractive index, films of similar thickness were placed between two silver mirrors to form a Fabry-Perot cavity. Since the resonance frequency of the cavity is a function of the optical length it serves as a measure for the effective refractive index.

The precursor PPV polycation and the negatively-charged SiO$_2$ nanoparticles interact to give a precipitate when mixed together. However, concentration conditions could be selected to overcome this problem (with low PPV and SiO$_2$ concentrations relative to the MeOH), and any slight precipitation could be removed by centrifugation. The optically-clear centrifugate could then be used to fabricate films with almost no scattering.

Photoluminescence measurements indicate that high photoluminescence efficiency is retained in the PPV:SiO$_2$ films, in contrast to PPV:TiO$_2$ films since, unlike TiO$_2$ particles, SiO$_2$ particles do not quench the PPV excited states. PPV-:SiO$_2$ films could therefore be preferred for use as emissive layers of electroluminescent devices. (Alternatively, quenching nanoparticles such as TiO$_2$ could be treated to carry a surface isolation or spacing layer of a material such as alkyl chains or SiO$_2$). The basic structure of such devices is well known and generally comprises a light-emissive organic layer, for instance a film of PPV, sandwiched between two electrodes. One of the electrodes (the cathode) injects negative charge carriers (electrons) and the other electrode (the anode) injects positive charge carriers (holes). The electrons and holes recombine in the organic layer generating photons. In PCT/WO90/13148 the organic light emissive material is a polymer. In U.S. Pat. No. 4,539,507 the organic light emissive material is of the class known as small molecule materials, such as tris-(8-hydroxyquinolino) aluminium ("Alq3"). In a practical device, one of the electrodes is typically transparent, to allow photons to escape the device.

This technique for varying refractive index could be used for matrices of other materials, especially other organic materials. The organic materials could be polymers, oligomers or small organic materials or blends of two or more such materials. As illustrated above the refractive index of the resulting material could be fixed by appropriate choice of the material of the nanoparticles and their volume fraction in the matrix. The effective refractive index could be estimated by the Bruggeman effective medium approximation. The refractive index is thus adjustable depending on the refractive index of the organic matrix and the nanoparticle, the loading volume fraction, and the dispersion morphology.

A prior approach to adjusting the refractive index of organic materials has been to blend two or more organic materials together. However, the effectiveness of this approach has been limited because organic materials tend to have very similar refractive indices, and are often incompatible, leading to large-scale phase separation.

EXAMPLE 2

Polymer Distributed Bragg Reflectors (Polymer Mirrors)

A distributed Bragg reflector (DBR) consists of a stack of regularly alternating higher-and lower-refractive index dielectrics (light transmissive materials) fabricated to fulfil the Bragg condition for reflection at the design wavelength. This occurs when the optical path of the periodicity in the dielectric stack corresponds to half a wavelength, and the reflectivity is further optimised when the DBR stack obeys the following equation:

$$\tfrac{1}{2}\lambda = n_1 d_1 + n_2 d_2,$$

where $n_1$, $n_2$ are the respective refractive indices; $d_1$, $d_2$ are the corresponding component film thicknesses in the DBR; and $\lambda$ is the design wavelength.

Figure 14:
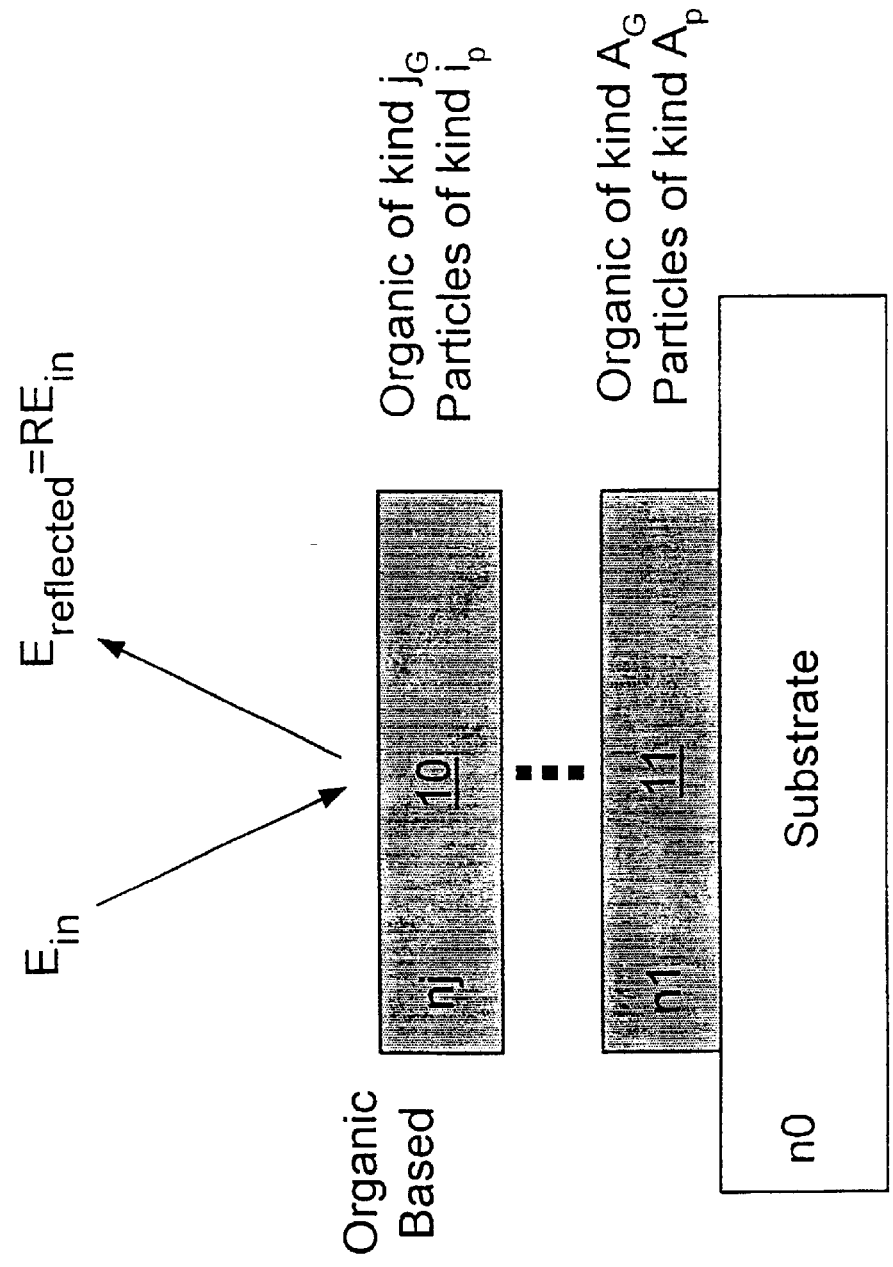
FIG. 14 illustrates the structure of a distributed Bragg reflector.

FIG. 14 shows a polymer distributed Bragg reflector (polymer mirror) in which the alternate layers are formed of PPV and PPV modified by the dispersion of TiO$_2$ nanoparticles to tailor its refractive index. To form the polymer DBR a 0.4 w/v % precursor PPV-MeOH solution (Cambridge Display Technology) containing 70 ppm AOT as surface tension modifier and a 0.7 w/v % (total solids) precursor PPV:TiO$_2$-MeOH solution (in which the ratio of precursor PPV to TiO$_2$ is 1:1.8 by weight) were alternately spun on glass and thermally converted at 180° C. under Ar for 1 h to gave 600–700 Å thick films of each material. The PPV material 10 forms the higher refractive index layers while the PPV:TiO$_2$ 11 forms the lower refractive index layers.

The exact spin conditions which determine the thicknesses $d_1$ and $d_2$ were set after measurement of the reflection spectra upon the completion of each pair of high-and low-refractive index layers. Feedback is thus provided to allow a DBR to be engineered with the desired value of $n_1 d_1 + n_2 d_2$.

The spin coating could be performed on to a substrate of, for example, glass or plastic, which could in addition have a transparent conducting layer for charge injection.

Figure 15:
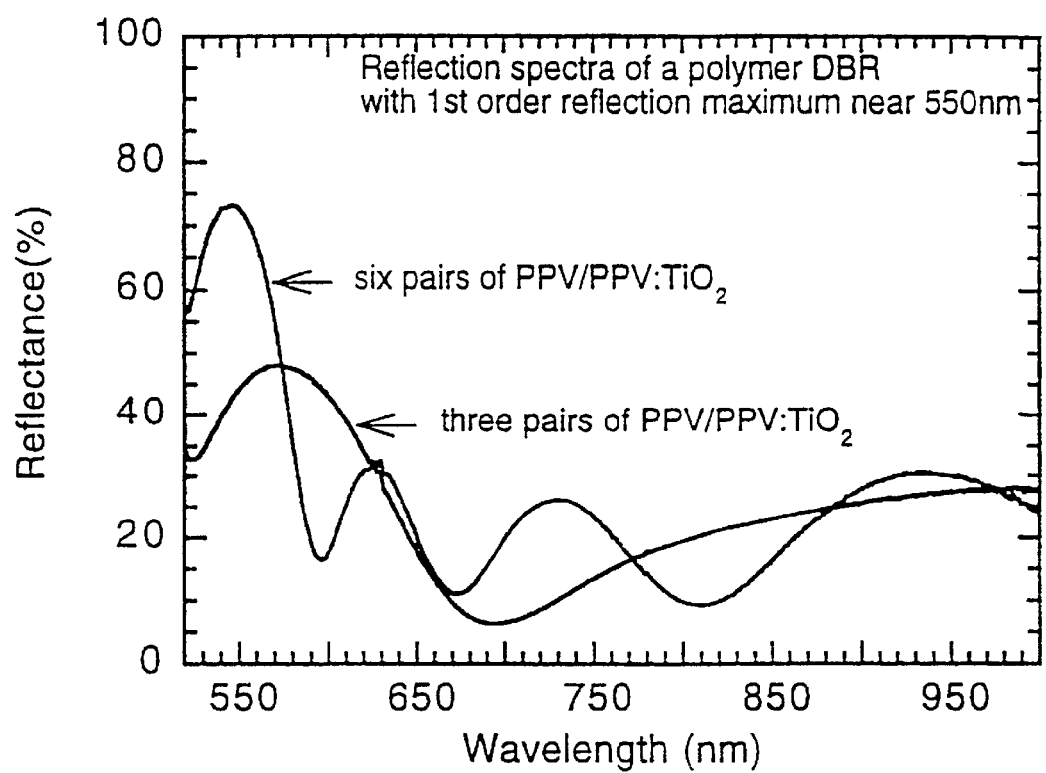
FIGS. 15 and 16 each show reflection spectra for two distributed Bragg reflectors showing that the reflection peak can be tuned.
Figure 16:
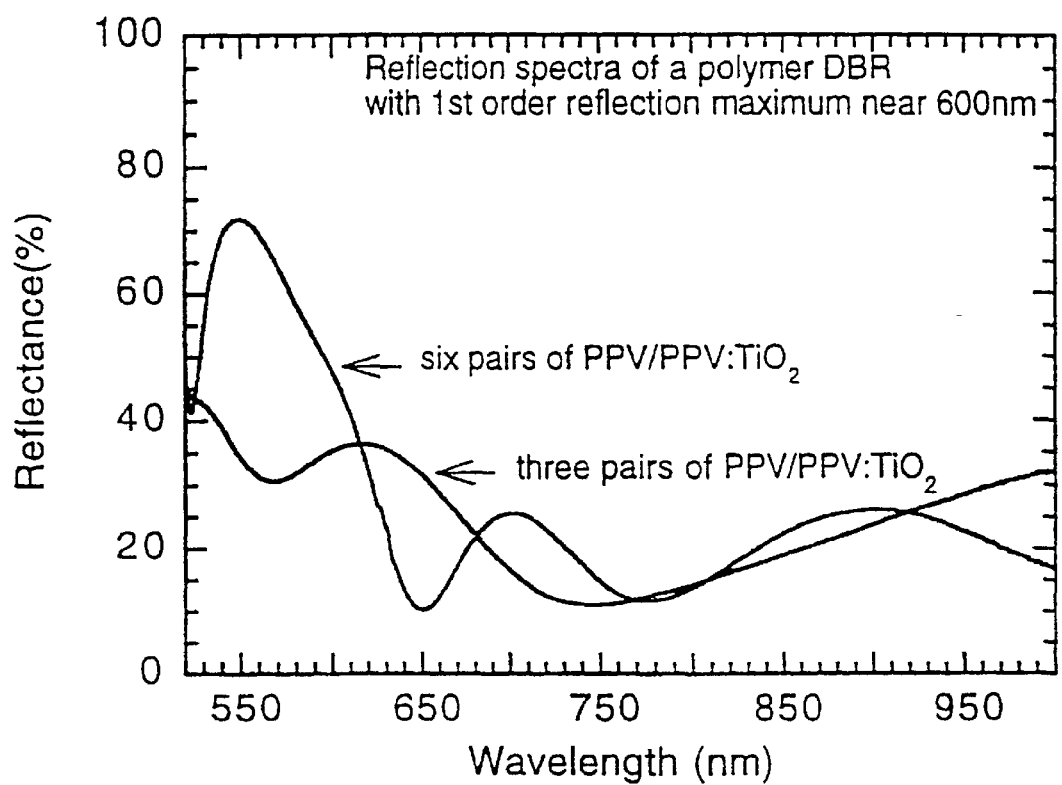

Reflection spectra for three and six-pair polymer layers with a first order reflection maximum at about 600 nm (see FIG. 15) and 550 nm (see FIG. 16) show the high level of control that can be achieved.

Since the DBR is formed of conjugated material it could be electically-pumped to generate photons in addition to reflecting.

EXAMPLE 3

Separate Confinement Heterostructures: Edge-emitting Organic Light Emitting Diodes The ability to vary the refractive index of a material by dispersing nanoparticles in it provides an important enabling technology for the fabrication of photonic structures. An example is a photonic structure that makes use of refractive index contrasts (variations) to confine optical photon modes, for example to form waveguide structures and/or separate confinement heterostructures (see for example: S. M. Sze, "Semiconductor Devices: Physics and Technology," John Wiley & Sons, New York, 1985). The inability to conveniently vary refractive index has hitherto been a major obstacle to the full exploitation of organic materials in optoelectronic device technologies.

Figure 17A:
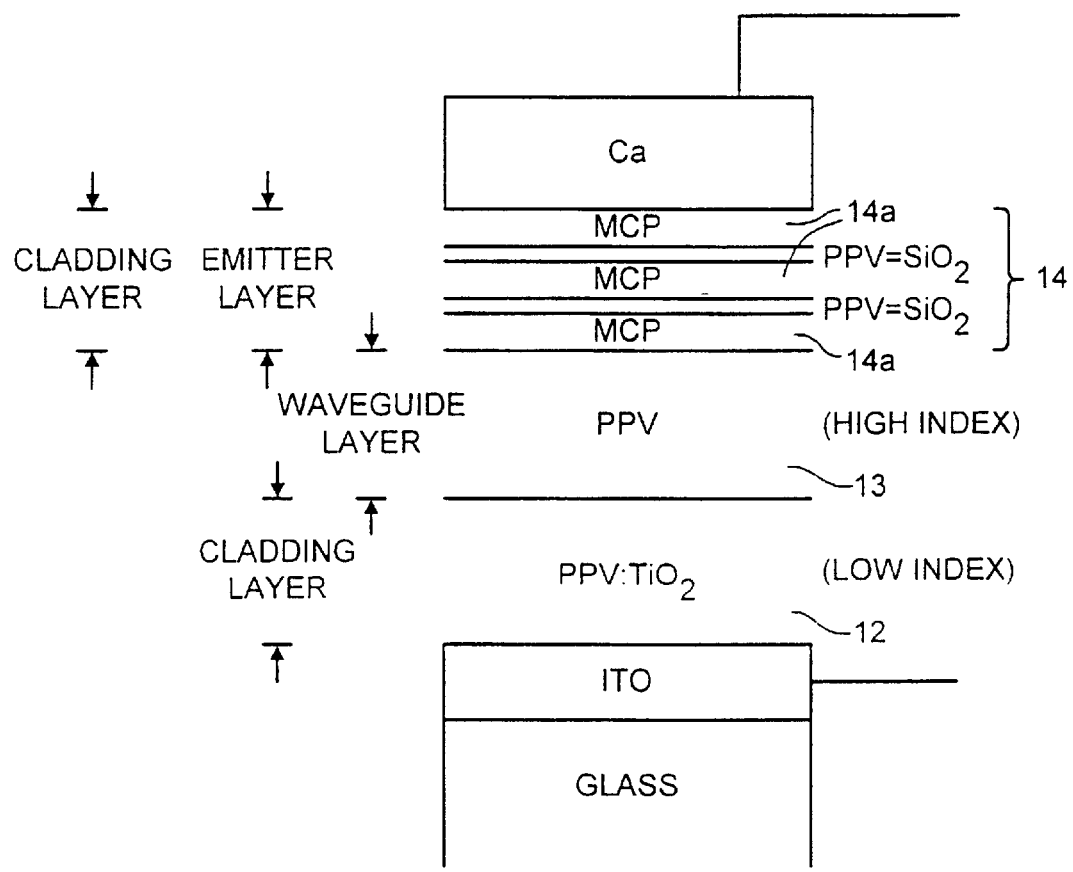
FIG. 17a shows the structure of an edge emitting organic light emitting device.

FIG. 17a shows an edge-emitting organic light-emitting diode (EEOLED) that emits in the plane of the LED rather than vertically through it as in conventional surface emitting LEDs.

Figure 17B:
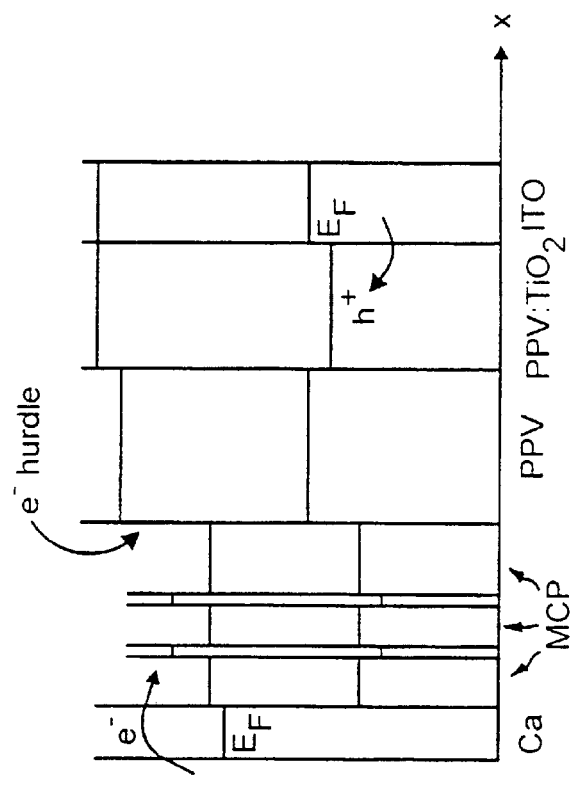
Figure 17B:
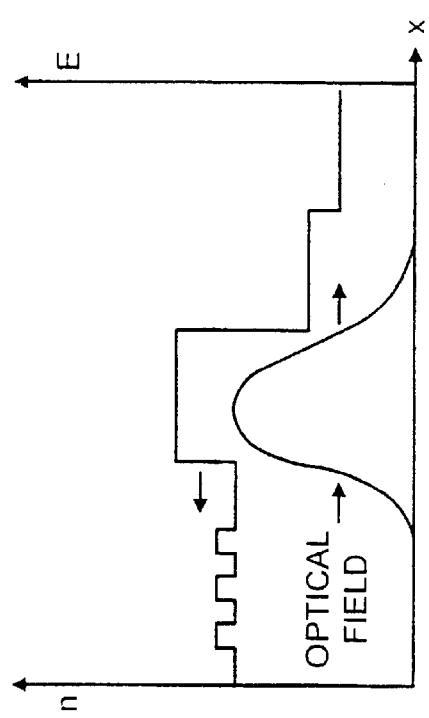

The EEOLED is fabricated by spin coating to give a multilayer structure as shown in FIG. 17a. There is a 3500 Å thick low-refractive index layer of PPV:$TiO_2$ 12, followed by a 2500 Å thick high-refractive index wave-guiding layer of PPV 13, and then a 1000 Å thick emitter layer of MCP 14 which is fabricated with a number of thin charge-transport "hurdle" layers of PPV:$SiO_2$ 14 a buried within the MCP layer. These PPV:$SiO_2$ thin layers provide a refractive index almost matching that of the adjacent MCP layers, but impose a weak electron and hole transport "hurdle" which can be exploited to enhance and direct recombination to occur largely in the MCP layer. Hence, during operation of the device, excitons are produced in this layer. Light-emitted from this layer is then wave-guided along the low-refractive index layer 12, which confines the photons, and emitted along the edge of the polymer film (see FIG. 17b). The excitons and photons are thus confined to separate regions of the device. In such a device the material properties of the region to which the excitons are confined can be tailored separately from those of the region to which the photons are confined: charge response and optical response properties of the conjugated material can be separated and individually modified or engineered to produce the desired electronic and photonic structure.

One advantage of this structure is that since the light is emitted from the edge of the device rather than the side there is no need for one of the electrodes of the device to be transparent, as in prior devices. Another advantage is that this structure forms the architecture for a wave-guiding electrically-pumped injection laser.

EXAMPLE 4

Nanoparticles as a Fluorescent Dye Carrier

By attaching functional materials to nanoparticles and dispersing those nanoparticles in a matrix the properties of the matrix can be adjusted. As an example of this technique, a device in which fluorescent die is attached to nanoparticles and dispersed in a PPV matrix will be described.

Figure 18:
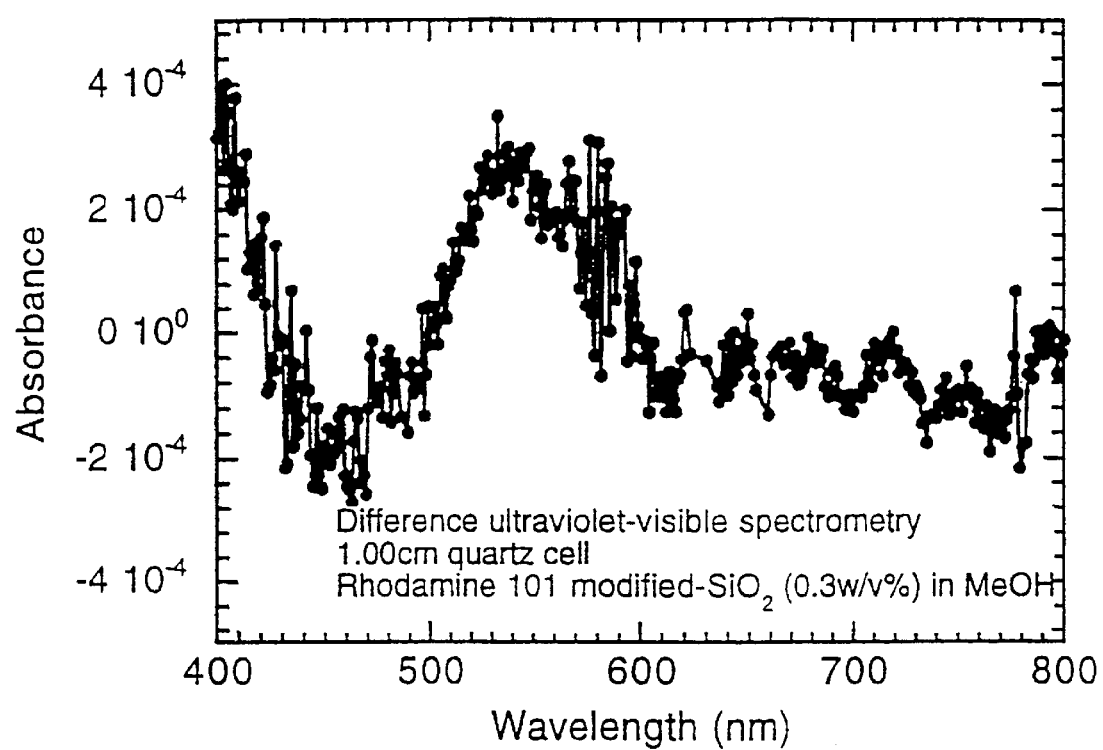
FIG. 18 shows difference UV-Vis spectra for PPV containing dye-loaded nanoparticles.

A (sub)monolayer of the well-known red laser dye Rhodamine 101 is first adsorbed on to $SiO_2$ nanoparticles prepared as described above. To achieve this equal volumes (1 ml) of a dilute 1 w/v % solution of Rhodamine 101 (a Xanthene) in EtOH was mixed with 1.1 w/v % $SiO_2$ in MeOH, and the homogeneous mixture dialysed against 200 ml HPLC grade MeOH through a 6–8 k MWCO cellulose dialysis tubing (Spectra/Por™) twice. Rhodamine 101 molecules not bound to the surface of the $SiO_2$ particles were dialysed out with the dialysate, whereas bound dye molecules were retained on the surface of the dispersed nanoparticles in the retentate. The retentate was then analysed by ultraviolet-visible spectrometry (see FIG. 18) to illustrate the principle that the surfaces of nanoparticles could indeed be used as a dye carrier.

The nanoparticles prepared in this way could then be used as for the nanoparticles of example 1 to disperse the fluorescent dye into a layer of PPV. This layer could form the active layer of an organic light emitting device, in which the fluorescent dye could be stimulated by emission from the PPV to emit light at another frequency. This could be particularly significant in the manufacture of tri-colour displays.

Further examples of the surface modification of nanoparticle surfaces with fluorescent dye molecules are given in B. Oregan and M. Gratzel, "A low-cost, high efficiency solar-cell based on dye-sensitised colloidal $TiO_2$ films," Nature 353 (1991) pp. 737–740. The surface modification could be preceded by surface modification by a suitable chemical, such as a silylation reagent, to cap the nanoparticles' surfaces with a layer carrying appropriate chemical functional groups (such as —COOH, —$NH_2$, —$SO_3H$, —$PO_3H$ or —$NR_3^+$) on which covalent or ionic or hydrogen bonds could be formed with an appropriate functional group on the dye molecule. This could help the dye to anchor to the surface of the nanoparticles. This may require modification of the dye molecules themselves to produce the desired functional group.

A wide range of fluorescent dye molecules are available, to provide sensitised emission over a wide range of frequencies, especially when used as a "guest" in a "guest-host" active layer structure where the host is a light emissive material which can stimulate the guest. In these structures, the matrix "host" layer, which could be of an organic material, performs the role of charge transport and acts as first-stage recombination centres, but subsequently the energy is to be transferred to the "guest" which then emits the desired colour. It is preferred that the energy transfer from the initial excitation created in the matrix to the final excitation to be created in the dye should be efficient, which in general demands that the emission spectrum of the initial ("host") excited state should overlap significantly with the absorption spectrum to the final ("guest") excited state. It is also preferred that the guest should exhibit a high photoluminescent efficiency; and that the density of the "guest" sites in the "host" matrix should be sufficiently high (preferably $10^{-17}$ to $10^{-19}/cm^3$) if the effective radius of energy transfer (the Forster radius) is small, e.g. about 3–10 nm.

Example of suitable dyes may include the class of molecules widely known as the laser dyes (such as coumarins, xanthenes and oxazines).

In the past a major stumbling block to the incorporation of dye molecules in matrices such as organic materials has been rapid diffusion and segregation (recrystallisation) of the dye molecules in the host layer or at the interfaces during storage, and especially during operation, so that emission efficiency falls rapidly. This problem can be addressed by the process described above of immobilising the dye by binding it to the surface of a nanoparticle which is relatively immobile in the matrix. Even with a diameter of 1–10 nm, the diffusion coefficient of a nanoparticle through a typical organic host could be expected to be several orders of magnitude lower than that of the dye molecules themselves.

EXAMPLE 5

Nanoparticles as a Polymer Morphology Modifier

This example demonstrates that nanoparticles that are intimately dispersed in a polymer matrix can modify the morphology (e.g. the chain conformation) of the polymer.

Figure 19A:
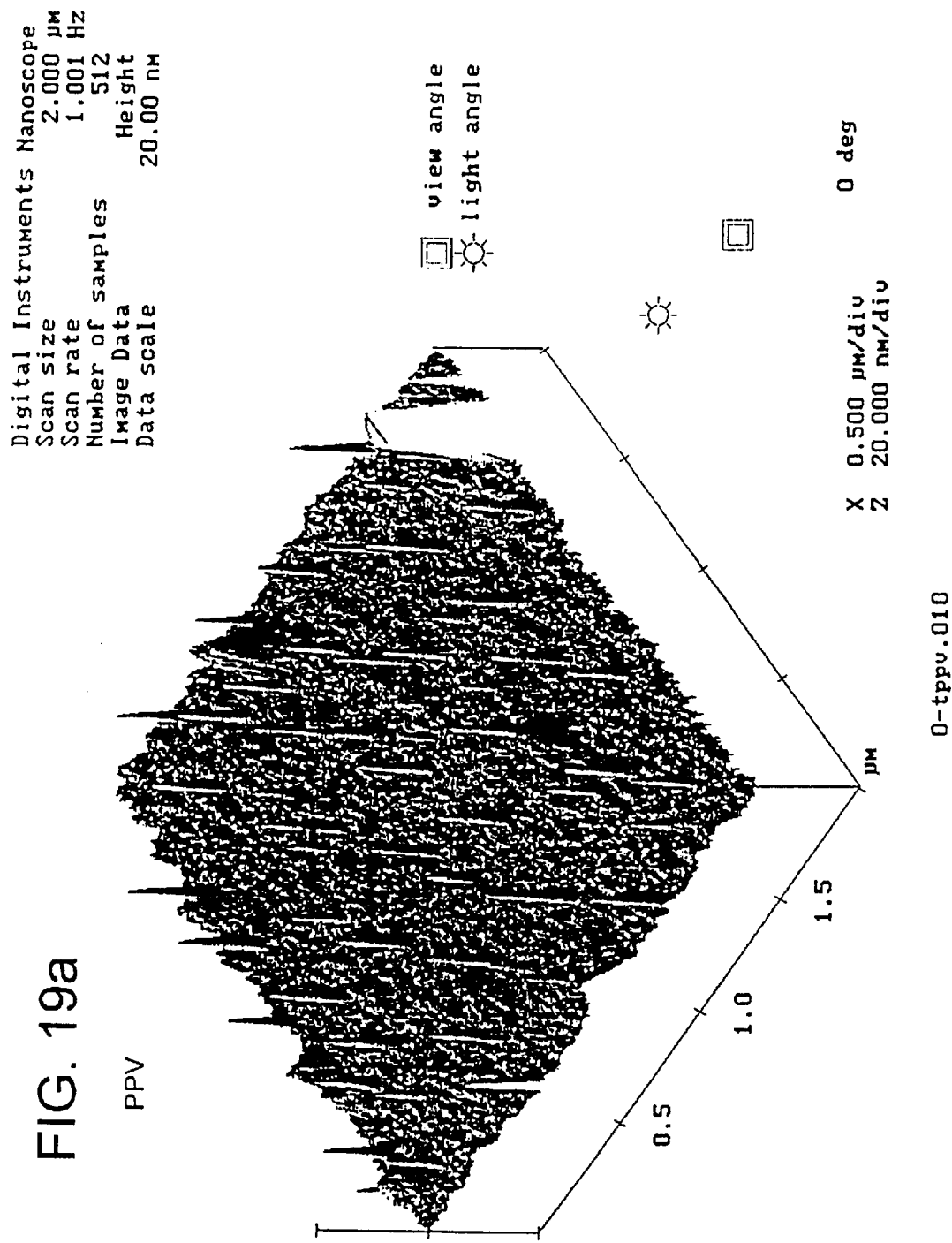
FIG. 19a shows the result of atomic force microscopy of a PPV film.

Polymer films of PPV:$TiO_2$ (having the same composition as the film C described above) and PPV (as control) were spun and subjected to atomic force microscopy examination. Both films were thermally converted at 180° C. FIGS. 19*a* and 19*b* show the results of the examination. The surface of the control film exhibits a number of nanoscale protruding domains (about 10–20 nm high and 20–40 nm wide) that are believed to be related to micro-crystallisation of the PPV chains in the film thickness direction (M. A. Masse, D. C. Martin, E. L. Thomas and F. E. Karasc, "Crystal morphology in pristine and doped films of poly(p-phenylene vinylene)," Journal of Materials Science 25 (1990), pp. 311–320). In contrast, films fabricated with the nanoparticles showed a relatively smooth featureless surface over the same length scale. This is believed to be due to the suppression of micro-crystallisation by the nanoparticles, probably by steric constraints and the introduction of kinks in the chain conformations in the interfacial layer next to the nanoparticle surface.

Figure 20:
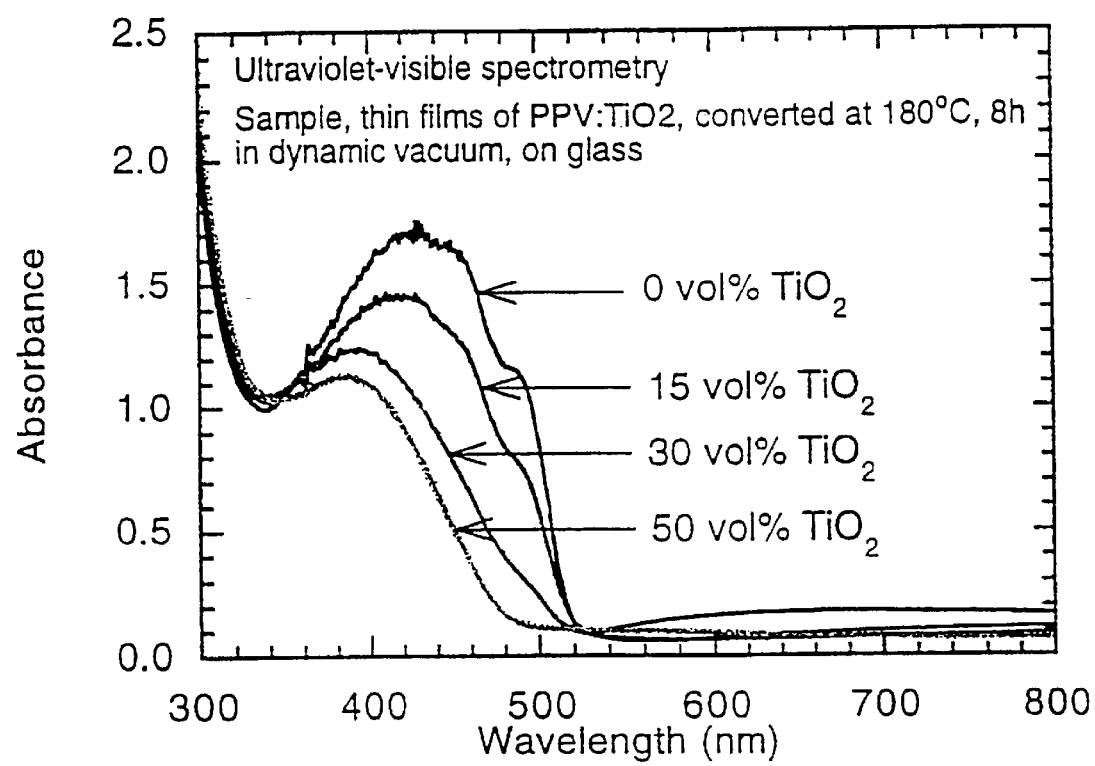
FIG. 20 shows UV-Vis spectra for PPV:$TiO_2$ films with differing amounts of $TiO_2$ nanoparticles.

Further evidence for this belief is given by ultraviolet-visible spectrometry of a set of films with a range of PPV:$TiO_2$ volume ratios, which showed a progressive blue shift of the $\pi$-$\pi$* transition with increasing nanoparticle content above 15% (see FIG. 20).

Thus, it appears that the presence of nanoparticles can induce perturbation of local polymer morphology, changing the effective conjugation length and/or crystallinity of the polymer matrix and thus its optical refractive index and other related properties.

This feature of organic/nanoparticle composites could be used to inhibit the recrystallisation of the organic during storage or in operation. Recrystallisation is generally undesirable as, taking optical devices as an example, it can cause changes in electrical behaviour, colour stability and luminous efficiency, with a deleterious impact on device performance. Altering morphology could also alter many "intrinsic" properties such as transport, binding energies (as for excitons) and efficiency.

General Issues

Nanoparticles for the above applications and other applications could be formed of materials other than $SiO_2$ or $TiO_2$. Depending on the application some properties of the particles that may have to be borne in mind are:

1. Transparency. To achieve this the particles would have to have a sufficiently large band-gap. For instance, where the nanoparticles are dispersed in a matrix of an emissive polymer and are required to be transparent to emissions from that polymer the particles should have a larger band gap than the polymer material. One possibility is to use transparent, non-metallic, inorganic particles. It is preferred that the optical bandgap of the nanoparticle material is equal to or larger than that of the matrix material, so that the absorption edge is not squeezed into the optical transparency window.

2. Insolubility (e.g. in water). This could be assessed in the first approximation by behaviour towards water as detailed in the CRC Handbook.

3. Resistance to acid corrosion. This is especially relevant where the nanoparticles are to be used in an acid environment, e.g. in PPV blends. This property could be assessed in the first approximation by bulk behaviour towards inorganic acids as detailed in the CRC Handbook.

4. Non-mobile ion forming. A cation-exchange process could be used to remove unwanted ions such as Nat from the preparation if they would otherwise interfere with performance.

5. Size. If uniform charge transport and high optical quality of the resulting body is a requirement then a preferred size range is about 5–10 nm. Particles greatly smaller than this may be undesirable because of lowered stability due to their higher surface-to-volume ratio. For transparency of bodies containing the nanoparticles it is preferred that the nanoparticles' diameters are generally less then half of the relevant light wavelength. If the body is small, such as a typical thin film of an optical device, it is preferred that the nanoparticles' diameters are less than half the thickness of the film, most preferably less than one fifth or one tenth of the thickness of the film. For a uniform (statistical) distribution the size of the nanoparticles should be $\frac{1}{5}$ ($\frac{1}{10}$) of the relevant size (wavelength or film thickness).

6. Dispersion. To improve dispersion of the nanoparticles, and reduce agglomeration, a surfactant coating could be provided on the surface of the nanoparticles. One example of a potentially suitable surfactant is sodium decussate (AOT). This is an ionic surfactant with short hydrophobic tails in the form of 2-ethylhexyloxy ester side-chains that may be expected to be compatible with and hence dispersible in MEH-PPV and a variety of polar casting solvents like MeOH and $CHCl_3$.

7. Suitable refractive index.

8, processable into homogenous blends with the matrix material, for example a desired emissive polymer.

Nanoparticles may be "blended" with sublimed molecule materials by forming a dispersed layer of particles and than subliming molecules on top of that layer. In this way the molecules (oligomers etc.) can fill in the gaps set by the particles. The formation of the first layer could be through spin coating or self assembly. This technique may also allow nanoparticles to be blended with materials that can be deposited by evaporation at high temperature as inorganic materials are deposited in a CVD (chemical vapour deposition) or MBE process or any variant or combination.

Another method that permits the refractive index and conductivity of conductive or semiconductive polymer films to be (preferably independently) tailored will now be described.

Doping of conjugated polymers (polymers with pi-conjugated backbone structures and/or pi-conjugated pendant groups) with strong protonic acid (p-doping) or strong oxidising (p-doping) or reducing agents (n-doping) is well established in the literature. However, the doping proceeds readily to completion in the presence of a stoichiometrc or excess amount of dopants. The system achieves the maximum doping with about 10–50% of the conjugated repeat units doped depending on the polymer system. For poly(p-phenylenevinylenes) and polyacetylenes, this is typically 10–20%; for polythiophenes, 20–30%; for polyanilines, 40–50%. This maximum level of doping imparts a high level of electrical conductivity of the order of 1–1000 S/cm to the polymers, depending on the nature and type of the polymers and dopants used, so that they become conducting polymers in the process. The bulk carrier concentration is then roughly of the order of $10^{20}/cm^3$ to $10^{21}/cm^3$.

However, this high level of doping is unnecessary or even undesirable for some applications. For example, for a 1-$\mu$m thick film (which is typical of the vertical thickness of photonic structures) having a conductivity of $10^{-6}$ S/cm, only a modest 1-V potential difference is required to drive a practical device current density of 10 mA/cm² through the film thickness direction. Therefore, film conductivities of the order of $10^{-6}$–$10^{-2}$ S/cm (typical of the semiconducting range) is already sufficient for these films to be employed in semiconducting photonic structures such as distributed Bragg reflectors and waveguides.

Furthermore, when the films are doped to the maximum, such as achieved by straightforward exposure to strong acids or oxidants, their optical properties change in drastic ways owing to the formation of new sub-gap transitions that change the refractive indices of the films and cause parasitic absorption of any emitted light. Both these factors are not desirable or acceptable for photonic applications. Therefore control of the bulk carrier concentration between $10^{17}$/cm³ to $10^{20}$/cm³, at an intermediate doping-level at least about one order of magnitude less than the maximally-doped case, is crucial.

It has now been found that one way to address the above issues is by having a controlled intermediate-level chemical doping (typically less than 10–20% of the maximum doping) of the conjugated polymer films, so that a selected level of electrical conductivity ($10^{-6}$–$10^{-2}$ S/cm) could be achieved through the photonic structure, preferably without compromising its optical performance, thereby providing an important building block to enable a new technology of semiconducting-polymer photonics for semiconducting-polymer optoelectronics. Such a control of doping at intermediate levels is not trivial. One difficulty is that the chemical driving force for maximum doping is very high, so that it is difficult to arrest the doping level at an intermediate value.

The present method is to incorporate an amount of dopant (typically at a level less than 10–20% of the amount required for full or maximum doping), or its precursor, into the polymer film, via chemical derivatisation on the conjugated polymer chain itself or chemical derivatisation on another polymer partner with which the first polymer is to be blended. This polymer partner itself may or may not be conjugated. Subsequent activation—by thermal, irradiation, chemical or other means—may be necessary if the dopant is incorporated in the precursor form to generate the active dopant to dope the polymer. This would obviously be unnecessary if the dopant is already incorporated in the active form. Preferred practical features include:

(i) The dopant level is stable and readily controllable.

(ii) Because the dopant moiety is immobilised on the polymer chains, it could then be dispersed uniformly or substantially uniformly into the film matrix, and rendered substantially non-diffusing and non-volatile.

This approach differs from other attempts to control the level of doping described in the literature. With the exception of A R. Brown, D. M. de Leeuw, E. E. Havinga, A. Pomp, "A universal relation between conductivity and field-effect mobility in doped amorphous organic semiconductors", Synthetic Metals, 68 (1994) pp. 65–70, which describes vacuum thermal treatment of highly-doped materials to remove volatile dopants, and which applies specifically only to polyanilines, all the other attempts are potentially difficult to implement in manufacturing technologies or unstable and irreproducible. Examples are: N. Camaioni, G. Casalbore-Miceli, A. Geri, "Hall mobility in poly(4,4'-dipentoxy-2,2'bithiophene) as a function of doping level", Applied Physics Letters, 73 (1998) pp. 253–255, which describes electrochemical control in chronoamperometric experiments; A. G. MacDiarmid, J. C. Chiang, A. F. Richter, A. J. Epstein, "Polyaniline—a new concept in conducting polymers", Synthetic Metals, 18 (1987) pp. 285–290, which describes external pH control of polyanilines; M. Ahiskog, M. Reghu, T. Noguchi, T. Ohnishi, "Doping and conductivity studies on poly(p-phenylene vinylene)", Synthetic Metals, 89 (1997) pp. 11–15, which describes time-dependent exposure to dopant solution; D. M. de Leeuw, "Stable solutions of doped thiophene oligomers", Synthetic Metals, 55–57 (1993) pp. 3597–3602, which describes mixing controlled amounts of dopants with the conjugated material; and C. C. Han, R. L. Elsenbaumer "Protonic acids: generally applicable dopants for conducting polymers", Synthetic Metals, 30 (1989) pp. 123–131, which describes doping of polyelectrolyte precursor PPV and substituted PPVs using counterion-derived low-vapour pressure protonic acids. In contrast the present method emphasises controlled intermediate-level chemical-doping to enable the semiconducting-polymer photonic-structure technology.

According to the present method a conjugated polymer is derivatised with a controlled concentration (typically at the level less than 10–20% of the amount required for full doping) of a dopant moiety(ies) or its(their) precursor form (s), or blended together with a polymer partner (which may or may not be a conjugated polymer itself which is derivatised with such moieties to give the equivalent dopant concentration. Photonic structures are then fabricated from materials, including higher-order blends and composites, containing these modified conjugated polymers by film-forming techniques. A subsequent thermal, irradiation or chemical activation step may be required to generate the active dopant to dope the conjugated polymer.

Figure 21:
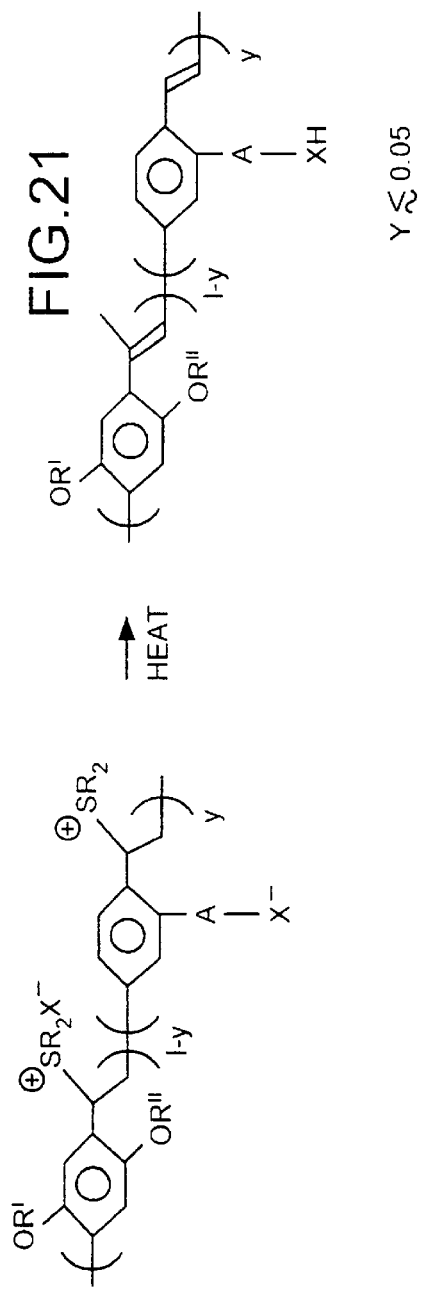

Examples of Possible Systems (i) Precursor polyelectrolyte PPV and substituted PPVs with counterion X⁻=phosphonates, sulfonates, phosphates, antimonates, borates, molybdates, etc. These counterions may form a side-chain attached to the polymer backbone. See FIG. 21, which shows the doping of substituted precursor polyelectrolyte poly(p-phenylenevinylene)s. In FIG. 21 OR' and OR" indicate the same or different alkoxy groups or nothing; X⁻ could, for example, be a phosphonate, sulphonate or phosphate and (as also below) A indicates an alkyl or aryl spacer or nothing.

(ii) Conjugated polymers (such as poly(alkylthiophenes) and poly(alkylfluorenes)) or their partners derivatised with a protonic acid group (Y=phosphonic acid, sulfonic acid, carboxylic acid, etc) as the dopant moiety; or their precursor in the form of esters, anhydrides, azides, hydrazides, amides, acid chlorides. The precursor form is capable of converting to the active protonic acid form under irradiation, thermal exposure, or by reaction with another chemical agent that may be originally deposited with the film or subsequently introduced to the film. In addition, the acid group or its precursor form could be spaced from the polymer main-chain by an alkyl or aryl spacer and could also be attached as a separate functional unit on the polymer chain.

Figure 22:
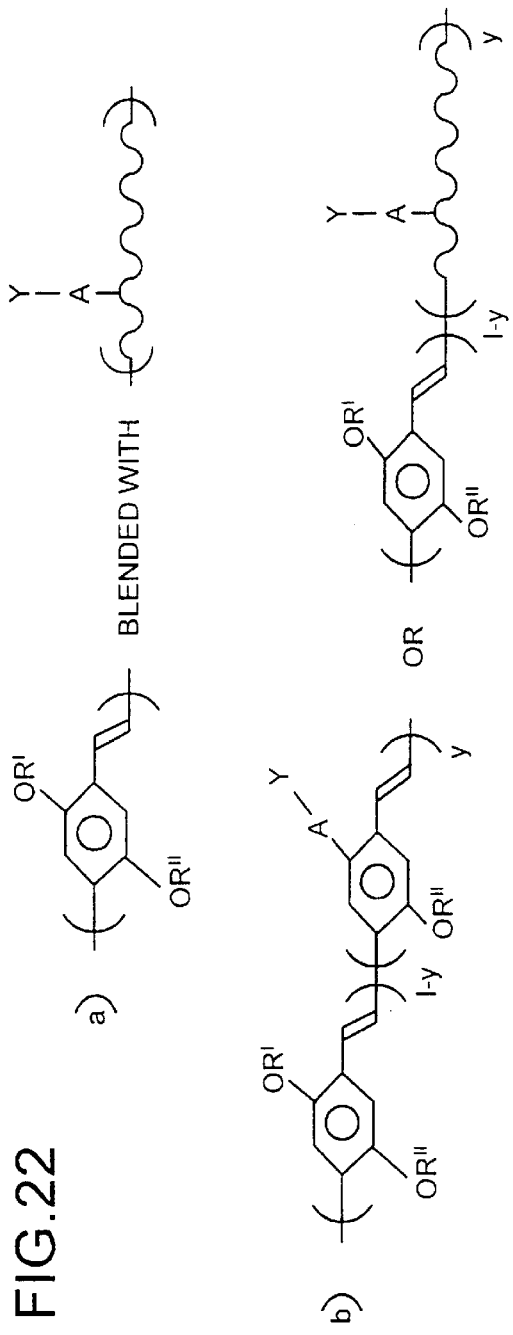

Non-precursor acid dopants include (a) phosphonic acid, (b) sulfonic acid, (c) fluorocarboxyl acid groups, see FIG. 22, which illustrates two schemes, in one of which a conjugated polymer host is blended with another polymer compatible with the host and bearing a dopant moiety Y and in the other of which a conjugated polymer is co-polymerised with a unit bearing a dopant moiety Y. In FIG. 22 Y indicates phosphonic acid, sulfonic acid or fluoroalkyl carboxyl acid. The main chain of the other polymer could be conjugated or non-conjugated.

Figure 23:
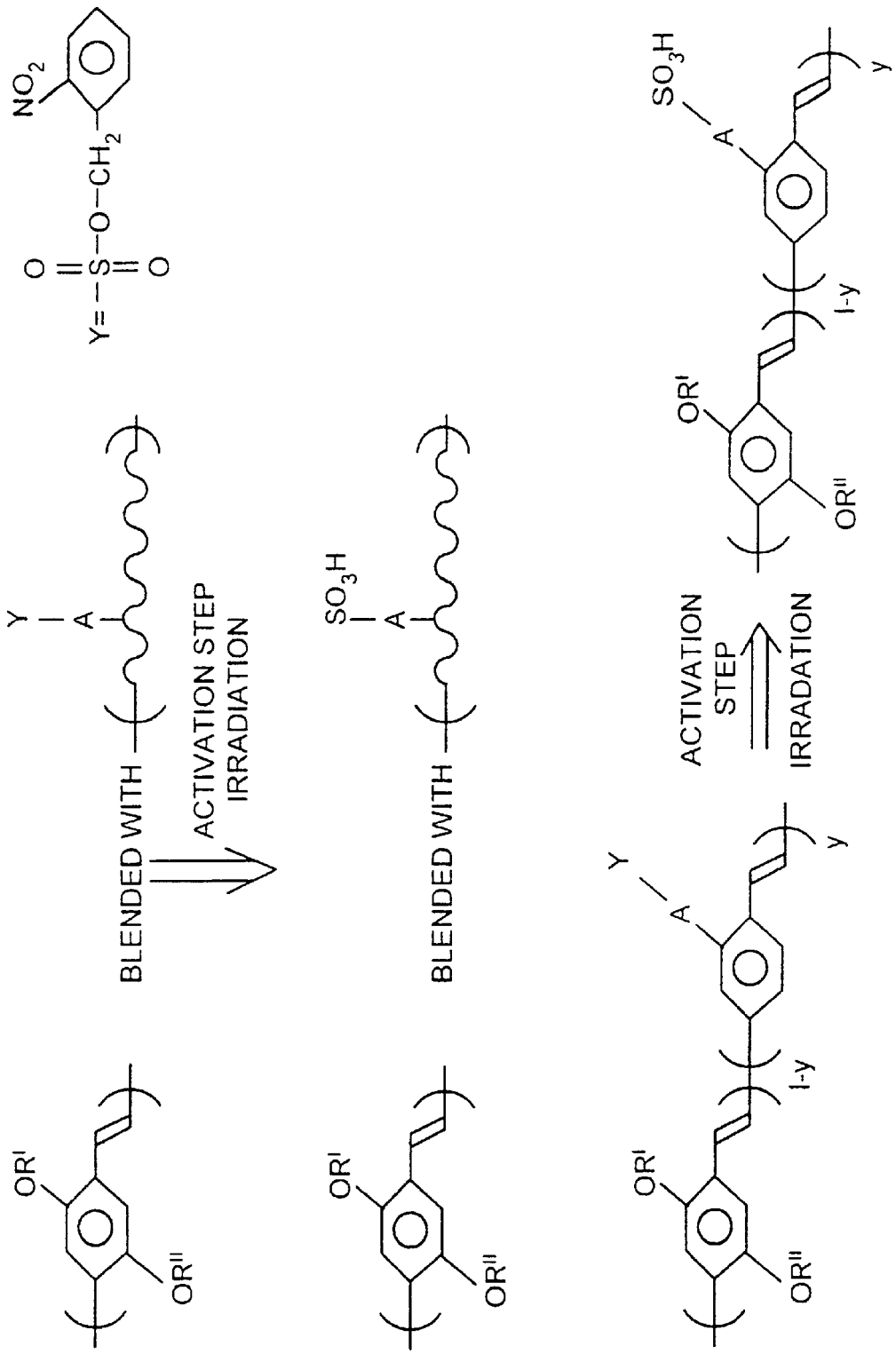
Figure 24:
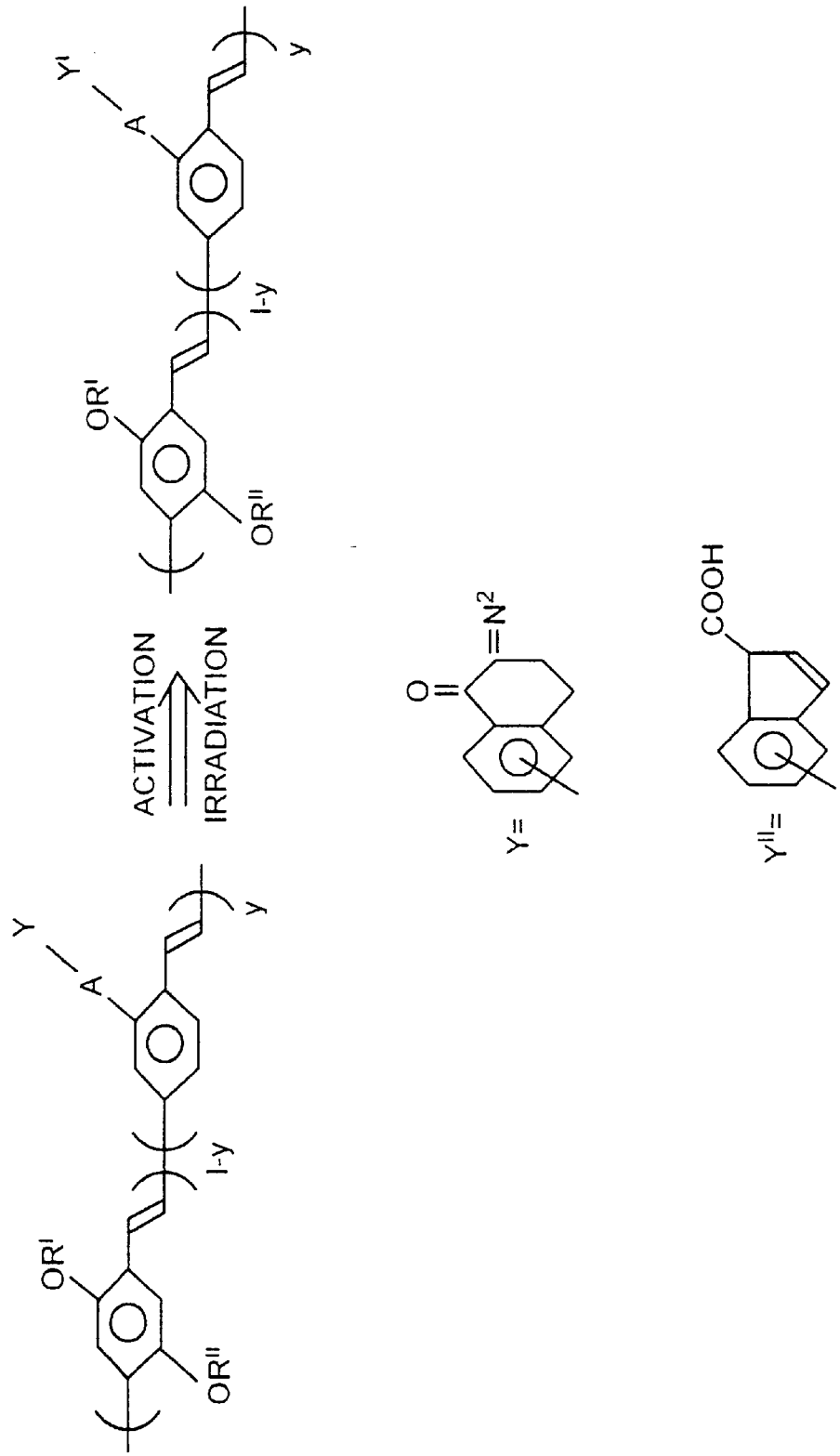

Precursor acid dopants include (a) o-nitrobenzyl sulfonate side-chains (converting to sulfonic acid group upon irradiation), see FIG. 23; (b) diazonapthaquinone sufonate side-chains (converting to indene carboxylic acid upon irradiation), see FIG. 24; (c) phosphonate or sulfonate ester side-chains, together with an incorporated photoacid generator (PAG) such as one of the onium salts (the onium salts generating a strong protonic acid upon irradiation which cleaves the sulfonate or phosphonate ester leaving group to the corresponding acid), see FIG. 25. See for example, A. Reiser "Photoreactive polymers: the science and technology of resists," John Wiley & Sons, New York, 1989. In FIG. 23 similar schemes to those of FIG. 22 may be used, the group Y being replaced as shown. In the approaches of FIGS. 24 and 25 the blending and co-polymerisation schemes may both be used, but for simplicity only the co-polymerisation scheme is illustrated. In the approach of FIG. 24 Y could be —$SO_3R$ or —$PO_3R_2$, where R is a leaving group; the PAG could be a diaryliodonium salt, triarylsulfonium salt or another onium salt; and Y' could be —$SO_3H$ or —$PO_3H_2$.

(iii) Conjugated polymers or their partners derivatised with a redox group based on Z=TCNQ, DDQ, TTF, ferrocene, viologen, iron(III) chelates, etc or their precursors. The precursor form is capable of converting to the active form under irradiation, thermal exposure, or by reaction with another chemical agent. These groups could also be spaced from the polymer main chain by an alkyl or aryl spacer or attached to separate functional units on the chain. The redox group could accept electrons or donate electrons to the conjugated units, thereby p-doping and n-doping the conjugated units, respectively. See FIG. 26. In the approaches of FIG. 26 the blending and co-polymerisation schemes may both be used, but for simplicity only the co-polymerisation scheme is illustrated. Y could be a ferrocenium or viologen as shown.

In each case y helps to determine the level of doping. The value of y is preferably less than approximately 0.05 or 0.01.

Figure 27:
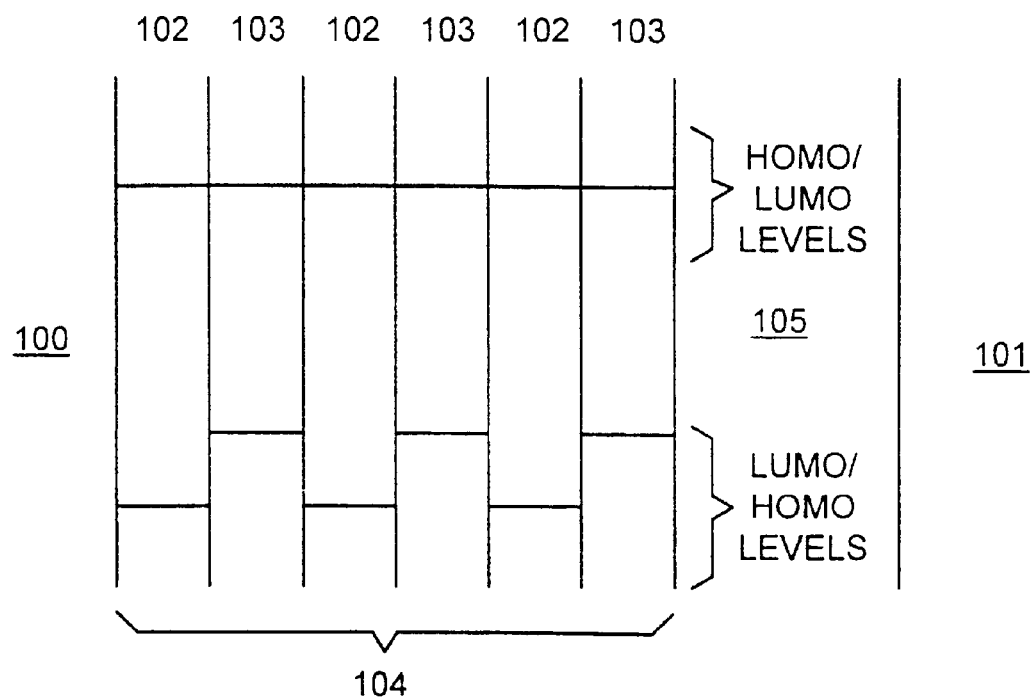
FIG. 27 illustrates a reflective structure comprising partially doped polymer layers.

Partially doped materials formed, for example, as described above could be used to form photonic structures such as distributed Bragg reflectors (potentially pumped reflectors), confinement heterostructures etc. in an analogous manner to those described above that incorporate nanoparticles. For example, FIG. 27 shows schematically the energy level structure of a DBR formed by means of partially doped conjugated polymer materials. In FIG. 27 region 100 indicates a first electrode, region 101 indicates a second electrode, layers 102 and 103 are alternating layers of a DBR 104 and region 105 is a conjugated polymer light emitting region. The doping of the materials is controlled so that the HOMO or LUMO levels (depending on whether the mirror is between the anode or the cathode and the emissive layer) of alternate layers of the mirror are at least approximately aligned so that the passage of holes/electrons through the mirror is not significantly impeded at the boundaries between layers of the mirror. The thicknesses of the layers of the mirror are chosen to satisfy the conditions for reflection. The refractive index of the layers is related to their band gaps, but by means of partial doping the HOMO/LUMO levels can be aligned independently of the band gaps.

Since the DBR is formed of conjugated material it could be electrically-pumped to generate photons in addition to reflecting.

The doped materials preferably comprise one or more polymers, most preferably one or more conjugated polymers. Specific aspects of the method relate to controlled intermediate-level doping of homopolymers, co-polymers, blends and composite materials of conjugated-polymers (i.e., polymers with partially or fully pi-conjugated backbone structures and/or pi-conjugated pendant groups); and to structures such as photonic structures fabricated with such doped materials.

A single device may include layers formed according to the doping method described above and layers that include nanoparticles.

The present invention may include any feature or combination of features disclosed herein either implicitly or explicitly or any generalisation thereof, irrespective of whether it relates to the presently claimed invention. In view of the foregoing description it will be evident to a person skilled in the art that various modifications may be made within the scope of the invention.

What is claimed is:

1. An optical device having a layer comprising an organic semiconductive material that includes a substantially uniform dispersion of light transmissive nanoparticles.

2. An optical device as claimed in claim 1 wherein the diameter of the nanoparticles is generally less than 30 nm.

3. An optical device as claimed in claim 1, wherein the presence of the nanoparticles influences at least one material property of the layer.

4. An optical device as claimed in claim 3, wherein the said property is an optical property.

5. An optical device as claimed in claim 4, wherein the said property is refractive index.

6. An optical device as claimed in claim 1, wherein the nanoparticles have a surface coating.

7. An optical device as claimed in claim 6, wherein the surface coating is of a material that influences at least one optical and/or electrical property of the layer, and/or influences the interaction of the nanoparticles with the organic material.

8. An optical device comprising:
   a layer comprising an organic semiconductive material that includes a substantially uniform dispersion of light transmissive nanoparticles;
   wherein the nanoparticles have a surface coating of a dye material; and
   wherein dye material influences at least one optical and/or electrical property of the layer and/or influences the interaction of the nanoparticles with the organic material.

9. An optical device as claimed in claim 8, wherein the dye is a fluorescent dye.

10. An optical device as claimed in claim 1, wherein the organic material is a light-emissive material.

11. An optical device as claimed in claim 8, wherein the dye is a fluorescent dye which is absorbent at an emission frequency of the light-emissive organic material.

12. An optical device comprising:
    a layer comprising an organic semiconductive material that includes a substantially uniform dispersion of light transmissive nanoparticles, wherein the presence of the nanoparticles influences the refractive index of the organic layer; and
    a stack of further layers adjacent to the organic layer, the layers defining a light-reflective structure.

13. An optical device as claimed in claim 12, wherein the layers define a distributed Bragg reflector.

14. An optical device comprising:
an optical waveguide comprising a relatively high refractive index layer located between two relatively low refractive index layers, at least one of those three layers being a layer comprising an organic semiconductive material that includes a substantially uniform dispersion of light transmissive nanoparticles, wherein the presence of the nanoparticles influences the refractive index of the organic layer.

15. An optical device as claimed in claim 14, wherein the relatively high refractive index layer comprises organic material that includes substantially uniform dispersions of light-transmissive nanoparticles whose presence influences the refractive index of that layer.

16. An optical device as claimed in claim 14, comprising a layer of light-emissive material alongside the waveguide.

17. An optical device as claimed in claim 16, wherein the energy level profile of the device is arranged to encourage light emission in the said layer of light-emissive material.

18. A method for forming an optical device, the method comprising forming a layer comprising an organic semiconductive material that includes a substantially uniform dispersion of light transmissive nanoparticles.

19. An optical device as claimed in claim 1, wherein the presence of the nanoparticles inhibits crystallization of the organic material.

20. An optical device as claimed in any preceding claim 1, wherein the amount of the nanoparticles in the layer comprising an organic material is between 5 and 50 volume %.

21. An optical device as claimed in claim 1, wherein the organic material is a polymer material.

22. An optical device as claimed in claim 1, wherein the organic material is a semiconducting polymer material.

23. An optical device as claimed in claim 21 wherein the organic material is soluble in a polar solvent.

24. A light-emitting device comprising a light-emitting layer located between two waveguide layers having a lower refractive index than the light-emitting layer, and wherein the light-emitting layer and/or the waveguide layers comprises an organic semiconductive material that includes a substantially uniform dispersion of nanoparticles.

25. An optical device comprising a reflective structure having a plurality of layers, each layer comprising a semiconductive conjugated polymer, the refractive indices of adjacent ones of the layers being different, wherein at least one of the layers comprises a substantially uniform dispersion of light transmissive nanoparticles.

26. A light-emitting device comprising a light-emitting layer comprising an organic semiconductive material that includes a substantially uniform dispersion of fluorescent nanoparticles.

27. An optical device as claimed in claim 25, wherein the semiconductive conjugated polymer is doped in an amount less than one tenth of that which would be required to fully dope the semiconductive conjugated polymer.

28. A reflective structure comprising a plurality of layers having alternating refractive indices, each layer comprising a substantially uniform dispersion of nanoparticles.

* * * * *

UNITED STATES PATENT AND TRADEMARK OFFICE
CERTIFICATE OF CORRECTION

PATENT NO. : 6,777,706 B1  Page 1 of 1
DATED : August 17, 2004
INVENTOR(S) : Tessler et al.

It is certified that error appears in the above-identified patent and that said Letters Patent is hereby corrected as shown below:

Column 22,
Line 49, after "wherein" add -- the --.

Column 23,
Line 30, after "in" add -- claim 1 --.

Signed and Sealed this

Sixteenth Day of November, 2004

JON W. DUDAS
*Director of the United States Patent and Trademark Office*